United States Patent
Warntjes

(10) Patent No.: US 9,041,393 B2
(45) Date of Patent: May 26, 2015

(54) INTERLEAVED SINGLE MAGNETIC RESONANCE SEQUENCE FOR MR QUANTIFICATION

(75) Inventor: Marcel Warntjes, Linköping (SE)

(73) Assignee: SyntheticMR AB, Linköping (SE)

( * ) Notice: Subject to any disclaimer, the term of this patent is extended or adjusted under 35 U.S.C. 154(b) by 651 days.

(21) Appl. No.: 12/509,022

(22) Filed: Jul. 24, 2009

(65) Prior Publication Data

US 2011/0018537 A1    Jan. 27, 2011

(51) Int. Cl.
*G01R 33/56* (2006.01)
*G01R 33/561* (2006.01)

(52) U.S. Cl.
CPC ........ *G01R 33/5602* (2013.01); *G01R 33/5615* (2013.01); *G01R 33/5616* (2013.01); *G01R 33/5617* (2013.01)

(58) Field of Classification Search
USPC ........................ 324/300–322; 382/128–131; 600/407–435
See application file for complete search history.

(56) References Cited

U.S. PATENT DOCUMENTS

| | | | |
|---|---|---|---|
| 4,634,979 A | 1/1987 | Riederer et al. | |
| 4,641,095 A | 2/1987 | Riederer | |
| 4,734,646 A * | 3/1988 | Shenoy et al. | 324/309 |
| 4,881,033 A | 11/1989 | Denison et al. | |
| 5,327,088 A * | 7/1994 | Pipe | 324/309 |
| 5,486,763 A | 1/1996 | Alfano | |
| 5,570,020 A * | 10/1996 | Bornert | 324/309 |
| 6,043,652 A * | 3/2000 | Liu | 324/309 |
| 6,265,873 B1 * | 7/2001 | Le Roux | 324/309 |
| 6,366,091 B1 * | 4/2002 | Takahashi et al. | 324/309 |
| 6,400,151 B1 * | 6/2002 | Haase et al. | 324/309 |
| 6,472,871 B2 * | 10/2002 | Ryner | 324/307 |
| 6,804,546 B1 * | 10/2004 | Thompson et al. | 600/410 |
| 6,823,205 B1 | 11/2004 | Jara | |
| 6,888,349 B2 * | 5/2005 | Fautz | 324/309 |
| 6,933,720 B2 * | 8/2005 | Zhang | 324/312 |
| 7,002,345 B2 | 2/2006 | Jara | |
| 7,233,818 B1 * | 6/2007 | Aletras et al. | 600/410 |
| 7,602,179 B2 * | 10/2009 | van der Kouwe et al. | 324/307 |
| 8,060,180 B2 * | 11/2011 | Pai | 600/410 |
| 8,228,060 B2 * | 7/2012 | Busse | 324/309 |
| 2001/0038283 A1 * | 11/2001 | Ryner | 324/307 |
| 2003/0073897 A1 * | 4/2003 | Fautz | 600/410 |
| 2003/0109781 A1 * | 6/2003 | Zhang | 600/410 |
| 2006/0161060 A1 * | 7/2006 | Pai | 600/431 |
| 2007/0167727 A1 | 7/2007 | Menezes et al. | |

(Continued)

OTHER PUBLICATIONS

Ordidge, R.J. et al. "High-speed multi-slice T1 mapping using inversion recovery echo planar imaging" Magn Reson Med 1990; 16:238-245.

(Continued)

*Primary Examiner* — Melissa Koval
*Assistant Examiner* — Tiffany Fetzner
(74) *Attorney, Agent, or Firm* — Piedmont Intellectual Property

(57) ABSTRACT

A magnetic resonance sequence includes an interleaved slice-selective pre-pulse and a slice-selective multi-echo acquisition. This sequence is repeated with different delays between the pre-pulse and the acquisition resulting in a matrix of complex images. Based on this matrix T1 and T2 relaxations, proton density and the B1 field can be estimated. These quantified parameters enable synthetic magnetic resonance imaging (MRI) and form a robust input for tissue segmentation in computer aided diagnosis for MRI.

23 Claims, 12 Drawing Sheets

(56) References Cited

U.S. PATENT DOCUMENTS

| | | | |
|---|---|---|---|
| 2007/0249929 A1* | 10/2007 | Jeong et al. | 600/410 |
| 2008/0116891 A1* | 5/2008 | van der Kouwe et al. | 324/312 |
| 2008/0319301 A1* | 12/2008 | Busse | 600/410 |
| 2009/0085564 A1* | 4/2009 | Goelman et al. | 324/307 |
| 2009/0267945 A1 | 10/2009 | Warntjes | |
| 2009/0273343 A1* | 11/2009 | Borthakur et al. | 324/307 |
| 2010/0103166 A1 | 4/2010 | Warntjes | |
| 2010/0127704 A1 | 5/2010 | Warntjes | |
| 2010/0268066 A1* | 10/2010 | Rehwald et al. | 600/419 |
| 2011/0018537 A1* | 1/2011 | Warntjes | 324/309 |
| 2011/0288398 A1* | 11/2011 | Park et al. | 600/410 |

OTHER PUBLICATIONS

Zhu, X.P. et al. "Magnetic resonance image synthesis using a flexible model" Br J Radiol 1994; 67:976-982.

Whittall, K.P. et al. "In vivo measurements of T2 distributions and water contents in normal human brain" Magn Reson Med 1997; 37:34-43.

McKenzie, C.A. et al. "Fast acquisition of quantitation T2 maps" Magn Reson Med 1999; 41:208-212.

Clare, S. et al. "Rapid T1 mapping using multislice echo planar imaging" Magn Reson Med 2001; 45:630-634.

Kellman, P. et al. "Phase-sensitive inversion recovery for detecing myocardial infarction using gadolinium-delayed hyperenhancement" Mag Reson Imag. 2002; 47:372-382.

Achiron, A. et al. "Brain MRI lesion load quantification in multiple sclerosis: a comparison between automated multispectral and semi-automated thresholding computer-assisted techniques" Magn Reson Imaging 2002; 20:713-720.

Gulani, V. et al., "Towards a single-sequence neurologic magnetic resonance imaging examination: multiple-contrast images from an IR TrueFISP experiment" Investig Radiol 2004; 39:767-774.

Bakshi, R. et al. "The use of magnetic resonance imaging in the diagnosis and long-term management of multiple sclerosis" Neurology 2004; 63:S3-11.

Hacklander, T. et al. "Virtual MRI: a PC-based simulation of a clinical MR scanner" Acad radiol 2005; 12:85-96.

Deoni, S.C.L. et al. "High resolution T1 and T2 mapping of the brain in a clinically acceptable time with DESPOT1 and DESPOT2" Magn Reson Med 2005; 53:237-241.

Deichmann, R. "Fast high-resolution T1 mapping of the human brain" Magn Reson Med 2005; 54:20-27.

Zhu, D.C. et al. "Full brain T1 mapping through inversion recovery fast spin echo imaging with time-efficient slice ordering" Magn Reson Med 2005; 54:725-731.

Oh, J. et al. "Quantitative apparent diffusion coefficients and T2 relaxation times in characterizing contrast enhancing brain tumors and regions of peritumoral edema" J Magn Reson Imaging 2005; 21701-21708.

MacKay, A. et al. "Insights into brain microstructure from the T2 distribution" Magn Reson Imaging 2006; 24:515-525.

Neeb, H. et al. "A new method for fast quantitative mapping of absolute water content in vivo" NeuroImage 2006; 31:1156-1168.

Warntjes, J.B.M. et al. "A Novel Method for Rapid, Simultaneous T1, T2* and Proton Density Quantification" Magn Reson Med 2007; 57:528-537.

Deoni, S.C.L. "High-resolution T1 mapping of the brain at 3T with driver equilibrium single pulse observation of T1 with high-speed incorporation of RF field inhomogeneities (DESPOT1-HIFI)" J Magn Res Imaging 2007; 26:1106-1111.

Datta, S. et al. "Segmentation of gadolinium-enhanced lesions on MRI in multiple sclerosis" J Magn Reson Imaging 2007; 25:932-937.

Warntjes et al. "Rapid Magnetic Resonance Quantification on the Brain: Optimization for Clinical Usage" Magnetic Resonance in Medicine, vol. 60, pp. 320-329, Jul. 28, 2008.

R. Maitra et al., Bayesian Reconstruction in Synthetic Magnetic Resonance Imaging. Proc. SPIE, 1998, pp. 39-47, vol. 3459.

M. Prastawa et al., Synthetic Ground Truth for Validation of Brain Tumor MRI Segmentation, Med Image Comput Comput Assist Interv., 2005, pp. 26-33, 8 (Pt 1).

K.H. Cheng et al., In-vivo Tissue Characterization of Brain by Synthetic MR Proton Relaxation and Statistical Chisquares Parameter Maps, Proc. 8th Symposium on Computer-Based Medical Systems, 1995, pp. 338-345, IEEE.

* cited by examiner

INTERLEAVED SINGLE MAGNETIC RESONANCE SEQUENCE FOR MR QUANTIFICATION

TECHNICAL FIELD

The present invention relates to a method, system and computer program product for generating a MR imaging sequence. The sequence can advantageously be used for retrieving the physical parameters T1 and T2 relaxation, proton density (PD) and the radio-frequent B1 field from a magnetic resonance (MR) sequence.

BACKGROUND

Magnetic Resonance Imaging (MRI) can generate cross-sectional images in any plane (including oblique planes). Medical MRI most frequently relies on the relaxation properties of excited hydrogen nuclei in water and fat. When the object to be imaged is placed in a powerful, uniform magnetic field the spins of the atomic nuclei with non-integer spin numbers within the tissue all align either parallel to the magnetic field or anti-parallel. The output result of an MRI scan is an MRI contrast image or a series of MRI contrast images.

In order to understand MRI contrast, it is important to have some understanding of the time constants involved in relaxation processes that establish equilibrium following RF excitation. As the high-energy nuclei relax and realign, they emit energy at rates which are recorded to provide information about their environment. The realignment of nuclear spins with the magnetic field is termed longitudinal relaxation and the time (typically about 1 sec) required for a certain percentage of the tissue nuclei to realign is termed "Time 1" or T1. T2-weighted imaging relies upon local dephasing of spins following the application of the transverse energy pulse; the transverse relaxation time (typically <100 ms for tissue) is termed "Time 2" or T2. On the scanner console all available parameters, such as echo time TE, repetition time TR, flip angle $\alpha$ and the application of preparation pulses (and many more), are set to a certain value. Each specific set of parameters generates a particular signal intensity in the resulting images depending on the characteristics of the measured tissue.

Image contrast is then created by using a selection of image acquisition parameters that weights signal by T1, T2 or no relaxation time PD ("proton-density images"). Both T1-weighted and T2-weighted images as well as PD images are acquired for most medical examinations. The RF excitation of the MR scanner is performed by a rotating B1 field inside an RF transmission coil. This coil is designed to generate a homogeneous B1 field such that the RF excitation is identical throughout the imaged object. In practice imperfection of the coil design and the presence of the imaged object itself may distort the B1 field such that the RF excitation, and with that the flip angle $\alpha$, may deviate from the intended value. This has an unanticipated effect on image contrast.

In conventional contrast imaging the absolute signal intensity observed in the images has no direct meaning; it is rather the intensity difference, the contrast, between different tissues that lead to a diagnosis. A more quantitative approach can be applied based on the measured physical parameters T1, T2 and PD (the B1 field is merely used to correct for scanner imperfections). Using T1, T2 and PD MR images can be synthesized that are very similar to conventional MR images but with a free choice of scanner setting TE, TR, $\alpha$ and pre-pulses. Moreover T1, T2 and PD form a robust input for tissue segmentation and classification which could lead to MR computer aided diagnose.

There is a constant need to improve diagnostic and imaging methods relating to MRI.

SUMMARY

It is an object of the present invention to provide an improved method and device for determining the physical parameters T1, T2 and PD.

This object and others are obtained by the method and device as set out in the appended claims. Hence a sequence that can measure all four parameters T1, T2, PD and B1 in one single sequence is provided. The advantage of a single sequence is that the MR scanner remains in an identical state, avoiding image intensity corrections, and the risk for patient movement is reduced, avoiding the need for image registration. Also the time required for using the MR scanner can be reduced.

In accordance with one embodiment, a method of processing a set of a number of x magnetic resonance (MR) slices includes in a first phase, or processing stage, using a slice-selective pre-pulse to saturate or invert a spin magnetization of a first slice n; and in a second phase, or processing stage, using a slice-selective, multi-echo acquisition of a second slice m. The first and second phases, or processing stages, are interleaved in a sequence, and n and m are integers in a range 1 ... x.

In accordance with one embodiment, the sequence is repeated a number of times where the delay between the pre-pulse and the acquisition on each particular slice is varied.

In accordance with one embodiment, the MR sequence is generated where the pre-pulse has a flip angle $\theta$ in the range 90-180 degrees, 90 degrees corresponds to a saturation pre-pulse, and 180 degrees corresponds to an inversion pre-pulse.

In accordance with one embodiment the acquisition corresponds to a multi-echo spin echo acquisition including refocusing pulses between the echo read-outs.

In accordance with one embodiment the acquisition corresponds to a multi-echo gradient echo acquisition without refocusing pulses between the echo read-outs.

In accordance with one embodiment each echo read-out generates a single k-space line for k-space.

In accordance with one embodiment each echo read-out generates multiple k-space lines for k-space using the Echo-Planar Imaging, EPI, technique.

In accordance with one embodiment the method further comprises generating a matrix of images with size a×b with a variation of a echo times and a variation of b delay times after the pre-pulse. In particular an increasing image intensity of the matrix of images as a function of delay time after the pre-pulse can be used to determine the T1 relaxation for each image pixel of the imaged object and/or a decreasing image intensity of the matrix of images as a function of echo time can be used to determine the T2 relaxation for each image pixel of the imaged object.

In accordance with one embodiment the ratio between the lowest and highest image intensity as a function of delay time after the pre-pulse is used to estimate the B1 field for each image pixel of the imaged object.

In accordance with one embodiment the proton density for each image pixel of the imaged object is estimated by correcting the image intensity for the T1, T2 and B1 effects.

The invention also extends to a MRI system adapted to generate images using a sequence generated by the method and to a computer program used to generate the sequence.

BRIEF DESCRIPTION OF THE DRAWINGS

The present invention will now be described in more detail by way of non-limiting examples and with reference to the accompanying drawings, in which:

FIG. 1a is a general view of a MRI system;

FIG. 1b is a flow chart of a method of processing a set of slices according to an MR sequence;

DETAILED DESCRIPTION

Figure 1:
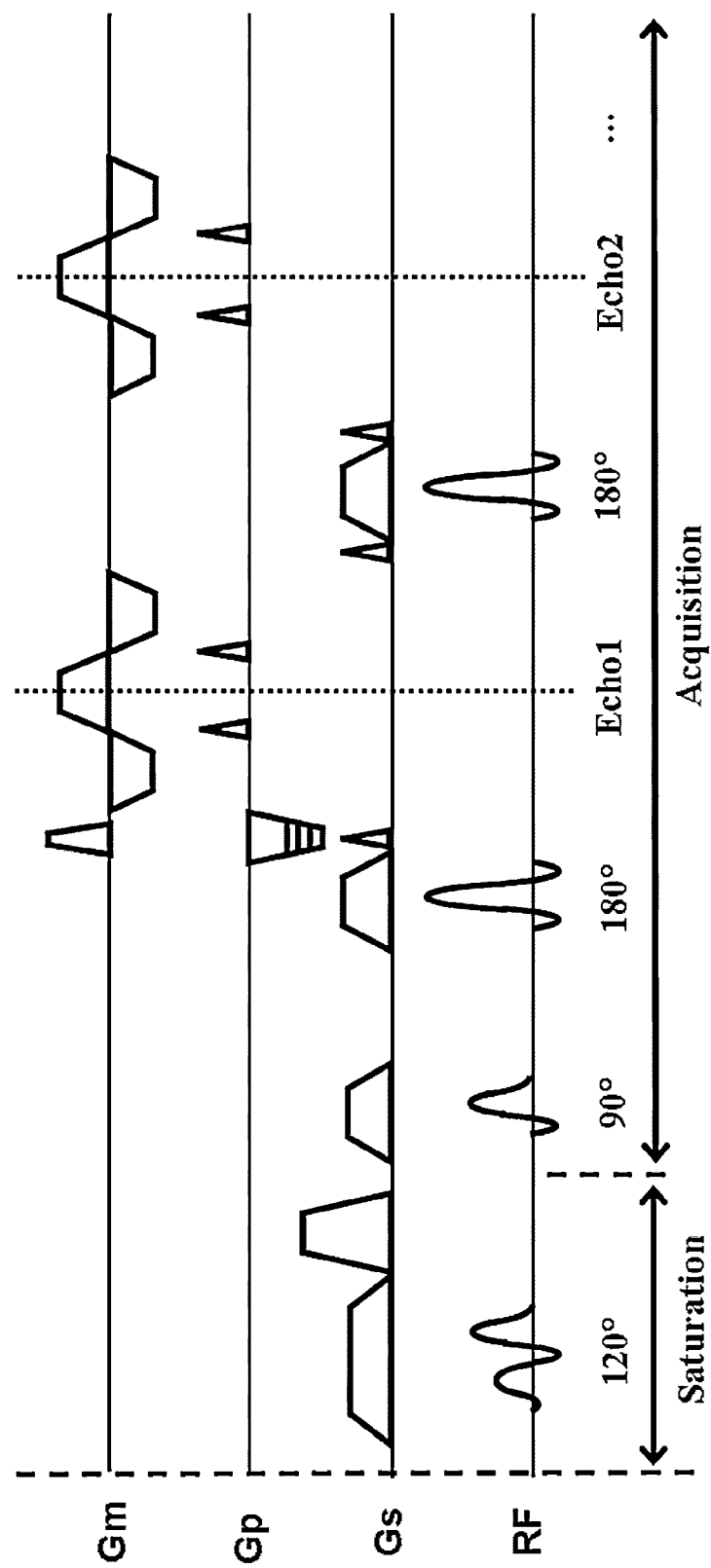
FIG. 1 is a schematic representation of a single block of the MR sequence.

In FIG. 1a a general view of a setup of a MRI system 100 is depicted. The system 100 comprises a MR scanner 101. The MR scanner is operative to generate MRI data by means of scanning a living object. The MR scanner is further connected to a computer 103 for processing data generated by the scanner 101. The computer 103 receives input commands from one or several input devices generally represented by an input device 105. The input device may be one or many of a computer mouse, a keyboard, a track ball or any other input device. The computer 103 is further connected to a screen 107 for visualizing the processed scanner data as a contrast image.

Figure 2:
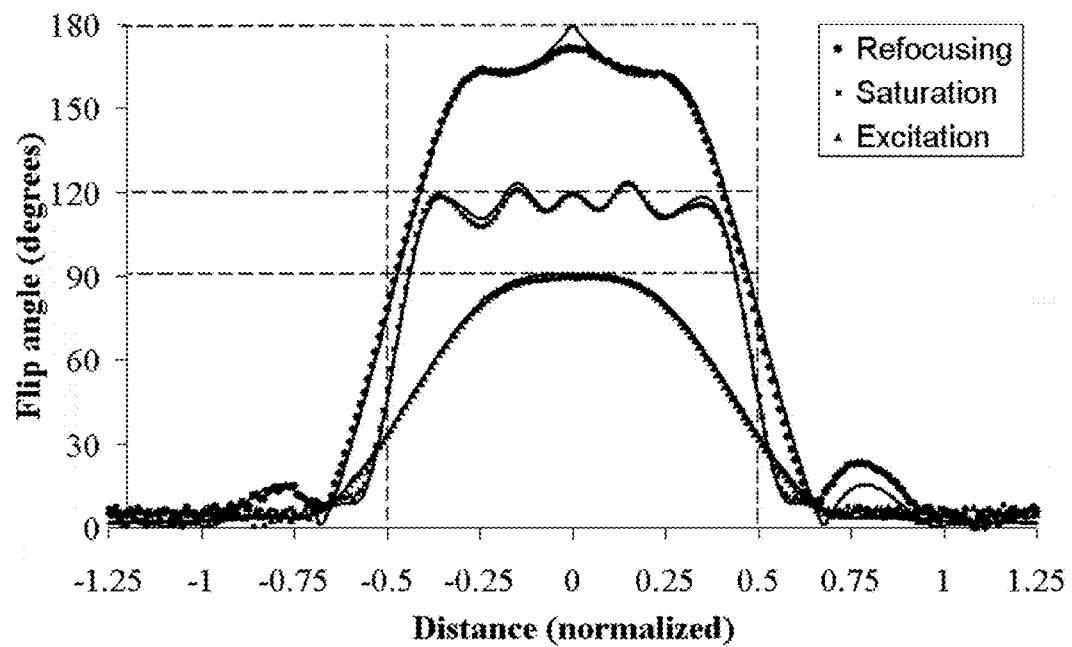
FIGS. 2-8 are plots and illustrations further illustrating a method and system for generating MRI images.

A basic block of the quantification sequence is shown in FIG. 2, with two phases in each block, repeated each repetition time $T_R$ over the complete measurement. In FIG. 2, the measurement (Gm), phase-encoding (Gp) and slice-selection (Gs) gradients and the RF pulse amplitude are shown over time. There are two phases in each block. In Phase 1 (Saturation), the pre-pulse with flip angle θ and subsequent spoiling acts on a slice m. In Phase 2 (Acquisition), the multi-echo acquisition is performed of slice n. In this particular embodiment multiple 180° refocusing pulses are applied for spin echo acquisition rather than gradient acquisition (no refocusing pulses) as well as the acquisition is accelerated with an Echo Planar Imaging factor 3 read-out scheme.

In the first phase a slice selective pre-pulse acts on a slice n, followed by spoiling of the signal ('Saturation'). The flip angle θ of this pre-pulse is in the range 90-180 degrees where the specific cases of 90 degrees correspond to a saturation pre-pulse and 180 degrees to an inversion pre-pulse. In the second phase a slice-selective acquisition of another slice m ('Acquisition'), consisting of multiple echoes is performed. Optionally the acquisition can be accelerated through an Echo Planar Imaging (EPI) technique that acquires several k-space lines per echo. By shifting the order of the slices n and m with respect to each other the desired delay time between the saturation and the acquisition phase of a particular slice can be set.

The result of this sequence is a matrix of complex images a×b with a different echo times and b different delay time after the pre-pulse. The increase of signal intensity as a function of delay time is a measure for T1 relaxation. Typically a mono-exponentional increase is assumed. The decrease of signal intensity as a function of echo time is a measure for T2 relaxation. Here, typically a mono-exponentional decrease is assumed. The B1 field can be retrieved from the signal increase as a function of delay time, described by the T1 relaxation, by taking the ratio between the lowest signal intensity $M_{T0}$ at delay 0, just after the pre-pulse, and the highest signal intensity $M_{TR}$ at delay $T_R$, just before the subsequent saturation pulse in the sequence where B1 is found according to:

$$B1 \propto a \cos(M_{T0}/M_{TR})$$

since the difference between $M_{T0}$ and $M_{TR}$ is entirely due to the effect of the pre-pulse and subsequent spoiling. Finally PD can be calculated by extrapolating the measured image intensity to echo time zero and repetition time infinite.

For ease of calculation the matrix might be reduced by retrieving T1 and B1 from the weighted sum of all images with identical delay times after the pre-pulse (matrix 1×b) and T2 from the weighted sum of all images with identical echo times (matrix a×1).

FIG. 1b depicts a flow chart of a method of processing a set of a number of x slices according to an MR sequence as described in this application. In a first phase (step 120), a slice-selective pre-pulse is used to saturate or invert a spin magnetization of a first slice n. In a second phase (step 122), a slice-selective, multi-echo acquisition of a second slice m is used. If more slices remain to be processed (Yes in step 124), new slices are chosen (step 126) and the process flow returns to step 120. If no more slices remain (No in step 124), the process flow continues. Thus, the first and second phases are interleaved in an MR sequence, and n and m are integers in a range 1 . . . x.

Additional aspects are described below, which is the text of Warntjes et al., "Rapid Magnetic Resonance Quantification on the Brain: Optimization for Clinical Usage", *Magnetic Resonance in Medicine* vol. 60, pp. 320-329 (Jul. 28, 2008).

Abstract

A method is presented for rapid simultaneous quantification of the longitudinal $T_1$ relaxation, the transverse $T_2$ relaxation, the proton density PD and the amplitude of the local Radio Frequency $B_1$ field. All four parameters are measured in one single scan by means of a multi-slice, multi-echo and multi-delay acquisition. It is based on a previously reported method, which was substantially improved for routine clinical usage. The improvements comprise of the use of a multi-slice spin-echo technique, a background phase correction and a spin system simulation to compensate for the slice-selective RF pulse profile effects. The aim of the optimization was to achieve the optimal result for the quantification of Magnetic Resonance parameters within a clinically acceptable time. One benchmark was high-resolution coverage of the brain within 5 minutes. In this scan time the measured inter-subject standard deviation in a group of volunteers was 2-8%, depending on the tissue (voxel size 0.8×0.8×5 mm). As an example the method was applied to a patient with Multiple Sclerosis where the diseased tissue could clearly be distinguished from healthy reference values. Additionally it was shown that, using the approach of Synthetic MRI, both accurate conventional contrast images as well as quantification maps can be generated based on the same scan.

Key-words: Quantitative $MR_1$, $T_1$ mapping, $T_2$ mapping, PD mapping, $B_1$ mapping, Synthetic MRI, neurodegenerative disease.

Introduction

Tissues in the human body can be distinguished with Magnetic Resonance Imaging (MRI) depending on their MR parameters such as the longitudinal $T_1$ relaxation, the transverse $T_2$ relaxation and the proton density PD. In clinical routine, the MR scanner settings, such as echo time $T_E$, repetition time $T_R$ and flip angle α, are most often chosen to highlight, or saturate, the image intensity of tissues resulting in a 'T$_1$-weighting' or a 'T$_2$-weighting' in a contrast image. These procedures are well-established and relatively quick. A major disadvantage of using such contrast images is that the absolute intensity has no direct meaning and diagnosis relies on comparison with surrounding tissues in the image. In many cases it is therefore necessary to perform several different contrast scans. A more direct approach is the absolute quantification of the tissue parameters $T_1$, $T_2$ and PD. In this case, pathology can be examined on a pixel basis to establish the absolute deviation compared to the normal values. Automatic segmentation of such tissue images would be straightforward and the progress of the disease can then be expressed in absolute numbers. An excellent overview of the use of absolute quantification on neurodegenerative diseases is provided in Ref. 1.

Although the advantages of absolute quantification are obvious its clinical use is still limited. At least two major hurdles need to be addressed to stimulate a wide spread clinical usage. For many methods, the excessive scan time associated with the measurement of the three parameters has so far prohibited its clinical application. However, in recent years there has been substantial progress (see e.g. Refs 2-14) and the method here presented allows for absolute quantification of $T_1$, $T_2$, PD and the $B_1$ inhomogeneity of a whole volume with high resolution in a mere 5 minutes. The second hurdle, which must not be underestimated, is the clinical evaluation of the images. So far, there is only limited experience in using absolute $T_1$, $T_2$ and PD maps in clinical routines and most radiologists will want to confirm their findings using conventionally weighted contrast images. The quantification scan might then be considered as superfluous in the limited time available for an examination. This item is addressed using the approach of 'Synthetic MRI' [15-20]. It is possible to synthesize any $T_1$ weighted or $T_2$ weighted contrast image based on the absolute parameters by calculating the expected image intensity as a function of a virtual set of scanner settings. Synthetic MRI can be seen as a translation of the absolute maps into conventional contrast images; thus, a single quantification scan can provide both the absolute maps and the contrast images for the examination.

A recently published manuscript explained a method that enabled rapid, simultaneous quantification of $T_1$, $T_2^*$, PD and $B_1$ field, called QRAPTEST [2]. The current work presents a substantially improved method that has been optimized to accommodate clinical use, dubbed 'Quantification of Relaxation times And Proton density by Multi-echo Acquisition of a Saturation recovery using TSE Read-out' (QRAPMASTER). Two main issues of the QRAPTEST method were addressed. Firstly, a spin echo sequence is used rather than a gradient echo sequence. In routine clinical practice, spin echo sequences are most commonly used owing to their insensitivity to susceptibility effects. These are caused by $B_0$ inhomogeneities in the volume of interest, leading to a $T_2^*$ relaxation in gradient echo imaging where $T_2^*$ is shorter than $T_2$. This may result in image blurring of the tissue interfaces at longer echo times. Secondly, the maximum excitation flip angle for the QRAPTEST acquisition was typically limited to 4-8 degrees due to its role as a correction factor in the calculation of $T_1$ relaxation. The QRAPMASTER approach uses a multi-slice sequence with a long repetition time between subsequent acquisitions, removing the limitation of the flip angle. The presented method is very signal efficient and accurate values of the absolute MR parameters with a large dynamic range over a complete volume can be obtained within the desired 5-minute benchmark.

Methods

General Sequence Design

A basic block of the quantification sequence is shown in FIG. 1, with two phases in each block, repeated over the complete measurement. In the first phase a slice selective saturation pulse θ acts on a slice n, followed by spoiling of the signal ('Saturation'). In the second phase a slice-selective spin echo acquisition of another slice m ('Acquisition'), consisting of multiple echoes that are acquired to measure the transverse relaxation time $T_2$, is performed. The acquisition can be accelerated through an Echo Planar Imaging (EPI) technique that acquires several k-space lines per spin echo (Gradient Spin Echo or GRaSE). The advantage of this technique is to simultaneously reduce the Specific Absorption Rate (SAR) of the measurement, making it attractive for high-field applications. The number of echoes and the echo spacing can be freely chosen to accommodate any dynamic range for the measurement of $T_2$.

By shifting the order of the slices n and m with respect to each other the desired delay time between saturation and acquisition of a particular slice can be set. By using different delay times, the longitudinal relaxation time $T_1$ after a saturation pulse is retrieved from multiple scans. Since the number of scans and the delay times can be freely chosen, the dynamic range of $T_1$ can also be set as desired. The freedom to choose the number of data points on the $T_1$ curve is an important difference compared to previously described multi-slice methods, where the number of data points are determined by the number of slices [e.g. 8, 9]. An important feature of the QRAPMASTER approach is that $T_1$ and $T_2$ maps are measured independently of each other and hence no error propagation can occur between the two. The sequence is very signal effective, the duty cycle of the receivers is approximately 50-60% of the total scan time, and there is no limit on the acquisition flip angle. By using a saturation pulse rather than a more common inversion pulse, another very significant advantage is the possibility to simultaneously measure the local $B_1$ field, as will be explained later. Based on $T_1$, $T_2$ and $B_1$ it is possible to retrieve the unsaturated magnetization $M_0$, which can be scaled to the proton density PD. The sequence results in black-blood imaging due to the constant saturation of flowing blood. A 'Regional Saturation' (REST) pulse was added, located parallel to the imaging volume, to avoid a difference in behavior of the first and last slices.

Pulse Profile Simulation

To correct for the non-ideal behavior of the slice-selective RF pulses on the quantification results, as well as to relate the observed saturation flip angle $θ_{eff}$ to the effective excitation flip angle $α_{eff}$, a spin system simulation of the complete sequence was performed. RF pulse simulations are excellently described in Ref. 21, where a geometrical system of magnetic spins was defined with the macroscopic longitudinal magnetization $M_Z=1$ and the transverse magnetization $M_{xy}=0$. The amplitude envelopes of the 120° saturation, 90° excitation and 180° refocusing pulses of the quantification measurement were obtained from the MR scanner software.

The envelopes were approximated as a set of RF block pulses of 1 μs unit time. The effect of the separate RF block pulses on the spin system was sandwiched with the effect of the simultaneously applied gradient field during a unit time. The complete quantification scan was simulated for each individual magnetic spin. The 120° saturation pulse was applied, rotating the spins around the y axis, and the resulting transverse magnetization $M_{xy}$ was spoiled with a strong z-gradient. After a delay of between 0 and 4000 ms a spin echo acquisition was performed, during which a $T_1$ relaxation of the magnetization was allowed using $T_1$=1000 ms. The spin echo acquisition consisted of the 90° excitation pulse, rotating the spins around the y axis, and a series of 180° refocusing pulses, rotating the spins around the x axis, together with gradient winders and rewinders. The macroscopic signal intensity was obtained as the integral of the x-component of the transverse magnetization $M_x$ of the spins.

Extraction of the Parameters

The complete quantification measurement consists of numerous scans with different delay times $T_D$, providing a $T_1$ relaxation curve after the saturation pulse. The steady state magnetization $M_{TD}$ at a specific delay time $T_D$ can be found using the recursive relation of magnetization over the repetition time $T_R$, using an excitation pulse α and the steady state magnetization $M_{TR}$ at the end of $T_R$, just before the subsequent saturation pulse:

$$M_{TD} = M_0 - (M_0 - M_{TR} \cos\theta)\exp(-T_D/T_1) \qquad (1)$$

$$M_{TR} = M_0 - (M_0 - M_{TD} \cos\alpha)\exp(-(T_R - T_D)/T_1) \qquad (2)$$

where $M_0$ is the unsaturated magnetization. Substituting Eq. 2 into Eq. 1, the magnetization $M_{TD}$ as a function of delay time $T_D$ after the saturation pulse becomes:

$$M_{TD} = M_0 \frac{1 - (1 - \cos\theta)\exp(-T_D/T_1) - \cos\theta\exp(-T_R/T_1)}{1 - \cos\theta\exp(-T_R/T_1)\cos\alpha} \qquad (3)$$

Hence, from the measured intensity at various delay times a fit can be performed to retrieve both $T_1$ and $M_0$. Furthermore, from the same $T_1$ relaxation curve the effective local saturation flip angle $\theta_{eff}$ can be found and thus the local $B_1$ field. This is done using the ratio between the magnetization $M_{T0}$ at time 0, just after the saturation pulse, and $M_{TR}$ at time $T_R$, just before the subsequent saturation pulse:

$$\theta_{eff} = a\cos(M_{T0}/M_{TR}) \qquad (4)$$

since the difference between $M_{T0}$ and $M_{TR}$ is entirely due to the effect of the saturation pulse and subsequent spoiling. Based on the observed $\theta_{eff}$ the actual local excitation flip angle $\theta_{eff}$ can be estimated as well, though this is not as straightforward because it requires knowledge of the RF pulse profiles and the actual spin behavior in a particular $B_1$ field. A simulation was performed to relate $\theta_{eff}$ to $\alpha_{eff}$ (see below).

As previously mentioned, each acquisition is performed using a multi-echo read-out that enables the simultaneous measurement of $T_2$ relaxation. Using $T_2$ and the fitted $M_o$ from the $T_1$ curve the intensity $S_{M0}$, proportional to $M_0$ at an echo time zero, can be retrieved. Proton density is then calculated from $S_{M0}$, including a number of scaling factors according to:

$$PD = C_{coil} C_{load} C_{vol} C_{pix} C_{temp} C_{arb} \frac{S_{M0}}{\sin(\alpha_{eff})\alpha_{eff}} \qquad (5)$$

where $C_{coil}$ is a scaling factor for the local sensitivity of the applied receive coil, $C_{load}$ is a scaling factor for load differences of the Quadrature Body Coil (QBC), $C_{vol}$ is a scaling factor to a 1 mm³ unit voxel volume, $C_{pix}$ is the scaling factor from image pixel values to MR absolute intensity values, $C_{temp}$ is a scaling factor for temperature differences between different measurements (phantoms versus humans), and $C_{arb}$ an arbitrary rescaling factor to display more convenient values. For more details see Ref. [2].

Fitting Algorithm

The fitting routine was performed as follows. The phase of the last dynamic echo images was used as a reference phase. For all other images this phase is subtracted to generate real images instead of modulus, identical to the phase sensitive method [22]. This removes the ambiguity of the signal sign that occurs in modulus images. The noise behavior of the resulting images is Gaussian rather than Rician, removing the potential overestimation of signal intensity at low signal strength.

A mono-exponential $T_2$ relaxation was retrieved from all images where the absolute intensity served as a weight in the least square fit. The expected intensity at an echo time of zero was subsequently calculated for all time points. Using this procedure all echo-images are projected onto a single $T_1$ curve at echo time zero. The saturation flip angle $\theta_{eff}$ was calculated according to Eq. 4 from this curve. Since the $B_1$ field was assumed to not change rapidly over the volume, a median filter of 10 mm was applied. A least-square fit on the $T_1$ curve results in an estimate of $T_1$ and $M_0$. In this fit $M_{T0} = M_{TC} \cos\theta$ was taken as an additional condition. Finally, $M_0$ was scaled to proton density.

Synthetic MRI

Using the approach of Synthetic MRI, it is possible to create contrast weighted images based on the quantified data using the well-known equations that describe MR intensity as a function of scanner settings, such as echo time $T_E$, repetition time $T_R$ and flip angle α, in relation to $T_1$, $T_2$ and PD [21].

$$S \propto PD \frac{1 - \exp(-T_R/T_1)}{1 - \exp(-T_R/T_1)\cos\alpha} \exp(-T_E/T_2) \qquad (6)$$

Inversion recovery images (e.g., FLAIR) can be calculated using the inversion delay time $T_R$, according to $$S \propto PD \left[\frac{1 - 2\exp(-T_{IR}/T_1) + \exp(-T_R/T_1)}{1 + \exp(-T_R/T_1)\cos\alpha}\right] \exp(-T_E/T_2) \qquad (7)$$

Since $T_E$, $T_R$, α and $T_{IR}$ are independent parameters, any contrast image can be synthesized. The fitting and visualization of the quantification data, as well as the calculation and the visualization of the synthesized MR images, were done using an in-house developed software program based on IDL (Research Systems Inc, Boulder, Colo.). Fitting a full data set requires in the order of 20 seconds on a Pentium III computer.

Sequence Details

All experiments were performed on a 1.5T Achieva scanner (Philips Medical Systems, Best, The Netherlands). The longitudinal magnetization after a saturation, an excitation and a refocusing pulse, and thus their effective flip angles as a function of slice distance, were determined by applying either of these pulses, followed immediately by gradient spoiling and acquisition perpendicular to the slice. This was done using an agar phantom with $T_1$ relaxation of 380 ms (previously determined) with a repetition time of 3 s. The observed intensity was corrected for the 10 ms delay between the center of the RF-pulses and the start of the actual acquisition. The intensity was normalized by repeating the measurement where the RF amplitude is set to zero. For the clinical scan 5 spin echoes were acquired using an EPI factor of 3 at multiples of 20 ms echo time. The resulting acquisition time per sequence block (FIG. 1) was 130 ms. The repetition time $T_R$ was set to minimum, which for the 20 slices was 2600 ms. A total of 4 dynamic scans were performed, with delay times between the saturation pulse and acquisition of 130, 390, 1170 and 2470 ms. The matrix size was $270^2$ over a Field of View of 215 mm, leading to an in-plane resolution of 0.8 mm, reconstructed to 0.75 mm. Further acceleration was achieved using a SENSE factor of 2, leading to a scan time of 5:14 minutes. To ensure steady-state conditions a single dummy acquisition was performed across all slices prior to each dynamic and the delay times were performed in reversed order. In addition, an 80 mm REST slab was located at the neck of the patient to suppress blood flow artifacts. To avoid potential errors in the measured $T_1$ curves due to slice crosstalk, the slice order of the quantification scan was chosen linearly, such that the error would become similar for each slice. In our view, this is a better approach than a standard interleaved slice order that could lead to a varying error of the $T_1$ curves per slice.

The QRAPMASTER sequence was compared to the golden standard methods for quantification. The $T_1$ relaxation was measured using the standard inversion recovery sequence, a single slice spin echo with TR=10 s and inversion delay times of 100, 400, 700, 1500 and 5000 ms. The $T_2$ relaxation was measured using a 3D multi-echo sequence with 15 spin echoes at intervals of 15 ms and TR=3 s. The $B_1$ field was retrieved using a flip angle sweep of a 3D gradient echo sequence with TR=8 s and flip angles at 30, 50, 70, 90 and 120 degrees. A sinus was fitted to the resulting intensity to retrieve the $B_1$ values.

To examine a patient with Clinically Definite Multiple Sclerosis (CDMS), $T_1$W images ($T_R$=590 ms, $T_E$=15 ms, resolution 0.8 mm) and the QRAPMASTER quantification scan were acquired. Gadolinium contrast agent was administered (Magnevist, Schering, Germany), followed by the acquisition of $T_2$W images ($T_R$=4400 ms, $T_E$=100 ms, resolution 0.6 mm) and $T_2$W-FLAIR images ($T_R$=6000 ms, $T_E$=120 ms, inversion delay 2000 ms, resolution 0.8 mm). Finally, a second acquisition of the $T_1$W images and the quantification scan was performed. For comparison, 10 healthy volunteers were investigated with the QRAPMASTER scan using a lower SENSE acceleration factor, which led to scan time of 8:35 minutes. All in-vivo studies were performed in compliance with the regulations of Swedish law.

Results

Effect of the RF Pulse Profiles

The 90° excitation, 120° saturation and 180° refocusing pulse were measured as described in the Methods section. The effective RF pulse flip angle in FIG. 2 is displayed as a function of distance across the slice, normalized to slice thickness, where 100 data points were measured per unit. The solid lines represent the simulation of the pulse angles based on their amplitude envelope over time and their associated gradients. To aid visual inspection, the ideal slice-selective 90°, 120° and 180° RF pulse angles are shown as dashed lines. As can be seen in FIG. 2, the ideal flip angle was only achieved at exactly the resonance in the center of the slice. Generally, all other frequencies have lower effective flip angles. Furthermore, there was a slight non-zero flip angle outside the intended slice thickness. The simulations of the RF pulses agree very well with the measured data, with only the central peak of the refocusing pulse not entirely resolved in the measurement.

The quantification sequence was simulated for each point in FIG. 2, using the actual non-ideal RF pulse profiles. The x-component of the transverse magnetization $M_x$ was integrated over the complete slice distance of FIG. 2 to reflect the signal intensity of the measurement. If ideal slice-selective RF pulses were used, the observed normalized intensity as a function of delay time would correspond to the dotted line in FIG. 3. The line starts at cos (120°)=−0.5 and approaches unity at infinite times after the saturation pulse. However, the intensity of all spin echo read-outs begins at −0.26 when using the non-ideal pulse profiles. A long delay after the saturation pulse, the first spin echo read-out intensity approaches 0.899, the second spin echo read-out approaches 0.954, and all subsequent spin echo read-outs approach a value close to the average intensity of 0.932.

The simulation showed that the signal obtained from the measurement reflects the actual $T_1$ decay, but will appear to be associated with both a lower effective saturation angle and a lower effective excitation angle than the intended nominal values. Using Eq. 4, the effective saturation pulse angle of the intensity curve of FIG. 3 was calculated to be 106° (cos(−0.26/0.932)) rather than the nominal 120°. From the first 10 spin echo read-outs, the effective excitation pulse angle $\alpha_{eff}$ (where $\int M_x = \int M_z \sin(\alpha_{eff})$) of the first read-out corresponds to 64.0°, the second read-out to 72.6° and the average read-out to 68.7°, rather than the nominal 90°.

The simulation was repeated for a number of different $B_1$ field strengths. The $B_1$ field varies across a patient, and the intended saturation and excitation pulse amplitudes thus vary accordingly. In FIG. 4a, the observed effective saturation pulse angle is shown as a function of the nominal saturation pulse angle. In FIG. 4b, the observed effective excitation pulse angle is shown as a function of the nominal excitation pulse angle. The dashed lines indicate the intended $B_1$ field.

The RF pulse simulations were also used to investigate the potential problem of cross-talk between slices, leading to a through-plane smoothing of the input data for the quantification. The simulation showed that the contribution of the signal outside a slice was about 7% of the total signal. Introducing a gap of 10% of the slice thickness between the slices reduced the amount to 3%.

Modification of the Fitting Algorithm

Based on the simulation results two modifications were incorporated into the fitting algorithm. Firstly, the measured intensities of each first and second echo were corrected. The intensity of the first echo was multiplied by a factor 1.036 and the intensity of the second echo was multiplied by a factor 0.977, such that the effective excitation angle became 68.7° for all spin echo read-outs at nominal $B_1$ field. This correction significantly improved $T_2$ estimation, since the method only uses a relatively low number of spin echo read-outs.

Secondly, the measured effective saturation pulse angle was related to the effective excitation pulse by combining FIGS. 4a and 4b into FIG. 4c, where the effective excitation pulse angle $\alpha_{eff}$ was plotted as a function of effective saturation pulse angle $\theta_{eff}$. With this diagram the observed saturation angle from the measurement can be converted into the effective excitation angle that was used to calculate the proton density (Eq. 5). As seen from FIG. 4c the relation between the pulse angles can be approximated by a simple $\alpha_{eff} = (\theta_{eff} - 34.5°) < 69°$. This empiric equation is applicable for values of $\theta_{eff}$ in the range 80°-115°, corresponding to a $B_1$ field inhomogeneity between 70 and 110%. Cross-talk between slices due to pulse profile imperfections were ignored for the quantification.

In Vivo Measurements on Volunteers

Absolute quantification of $T_1$, $T_2$ and PD was performed on 10 healthy volunteers (Mean age 29 years, 8 male, 2 female). Table 1 summarizes the normal values for various anatomies of the brain. These values correspond well with those from the literature. Note that the average values of white matter vary smoothly across the brain, $T_1$ is shorter in the frontal part of the brain than in the occipital part and $T_2$ is slightly higher in the center of the brain. The thalamus showed different values across the tissue and the values of its center were chosen for the Table. Most voxels containing cortical grey matter are affected by partial volume effects with nearby cerebro-spinal fluid (CSF) or white matter, and the intrinsic absolute values are difficult to retrieve. The proton density of CSF appears somewhat high, possibly due to flow-effects or diffusion. In spite of these notions, the average values fall within a relatively narrow range.

For validation, the clinical QRAPMASTER sequence results of a single slice of the brain from a healthy volunteer were compared to the golden standard methods for $T_1$, $T_2$ and $B_1$. Combining these three methods also retrieved the PD. FIG. 5a displays the $T_1$ relaxation measured by QRAPMASTER and FIG. 5b displays the relaxation measured by the reference standard inversion recovery. The scaling is 0-2000 ms. There is clearly a significant blurring in FIG. 5b caused by movement of the volunteer over the total acquisition time of 19 minutes of the inversion recovery images. The cortex appears thicker and the ventricles show an edge artifact. Regions Of Interest (ROI) were placed at various locations. The measured values of all pixels within the ROI's of the reference $T_1$ measurement were plotted in FIG. 5c as a function of the measured values using QRAPMASTER. The scale for the relaxation times is logarithmic. Most regions are in excellent agreement. For CSF, there is a significant spread of measured values. This is caused by partial volume effects at the tissue interface of CSF with white matter where values are sensitive to the slightest, sub-pixel size, misregistration between the two sequences. To avoid this effect, most ROI's were placed in more or less homogeneous regions. The mean difference for the ROI's, excluding CSF, was 6.2%.

Similarly, the results of the same QRAPMASTER measurements were compared to the multi-echo sequence (scan time 5 minutes) in FIGS. 5d-f. The scaling is 0-200 ms. The $T_2$ values obtained by both methods were very similar with a mean difference of 5.2% (excluding CSF), mainly caused by the difference in the values of subcutaneous fat (42 ms using QRAPMASTER versus 51 ms for the reference method). A comparison with the flip angle sweep method is shown in FIGS. 5g-i. Both images were median smoothed over 10 mm. Still, movement artifacts in the 13-minute scan time and insufficient magnetization recovery in the 8 s repetition time led to incorrect values for CSF using the flip angle sweep method, as seen from the large cloud of data points to the right side of the plot in FIG. 5i. It is also clear that the standard deviation of the values from the reference method is much larger than those of the QRAPMASTER method, despite a longer scan time.

All reference methods were combined to calculate the proton density of the axial slice. The comparison is displayed in FIGS. 5j-l. The scaling is 500-1000 for PD, where 1000 corresponds to pure water at 37° C. All errors in the previous parameters propagate to PD and the combined reference methods, with a total scan time of 37 minutes, result in only a moderately accurate image (FIG. 5k). The mean difference of the values in FIG. 5l is 12.1%.

In Vivo Measurements on a Patient with MS

The quantification method was applied to a patient with Clinically Definite Multiple Sclerosis, both before and after the administration of Gadolinium contrast media. The post-Gd absolute MR tissue parameters $T_1$, $T_2$, $B_1$ and PD of a transversal slice of the patient's brain are shown in FIGS. 5m-p, and are similar to FIGS. 5a, d, g and j. The administration of Gadolinium did not result in significant differences in relaxation times, indicating the absence of a blood-brain barrier leakage. The cortical tissue of the patient had an average $T_1$ relaxation of 1022±45 ms before and 998±47 ms after Gd, and a $T_2$ relaxation of 87±4 ms both before and after Gd. The proton density was 880±35. For frontal white matter, these values were $T_1$=598±34 and $T_2$=70±4 before Gd, $T_1$=578±36 and $T_2$=68±5 after Gd, and the proton density PD=670±21.

Figure 5:
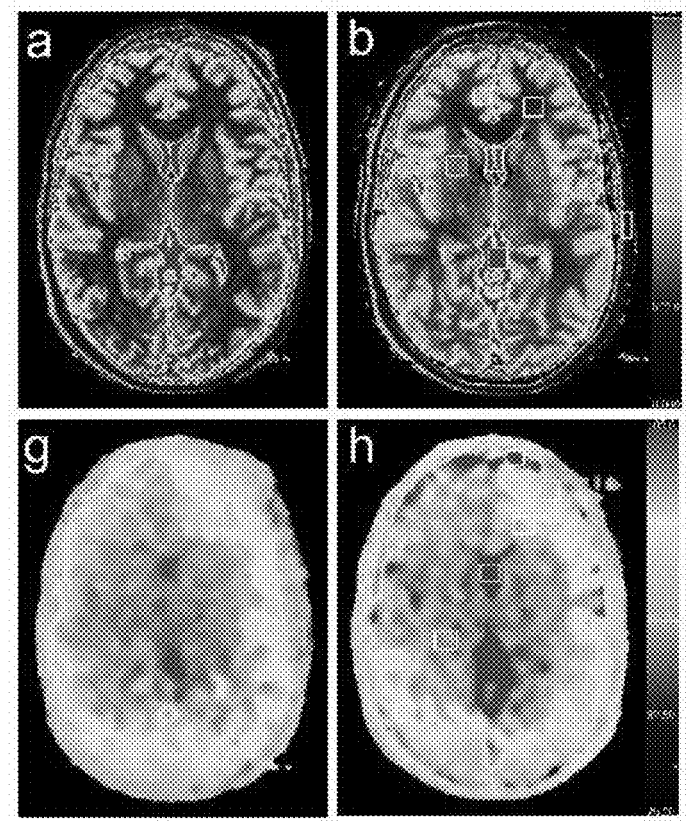
Figure 5:
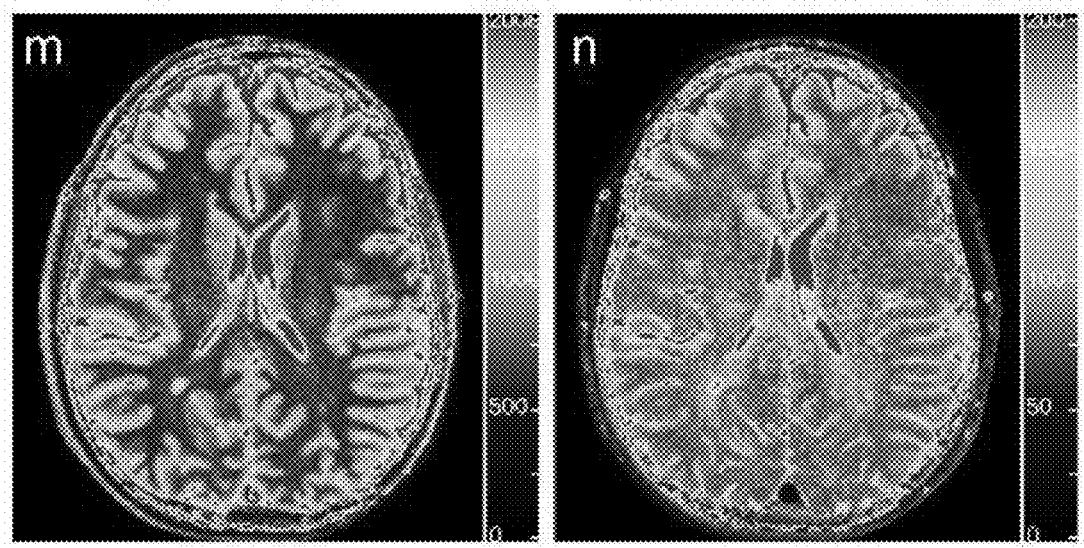
Figure 5:
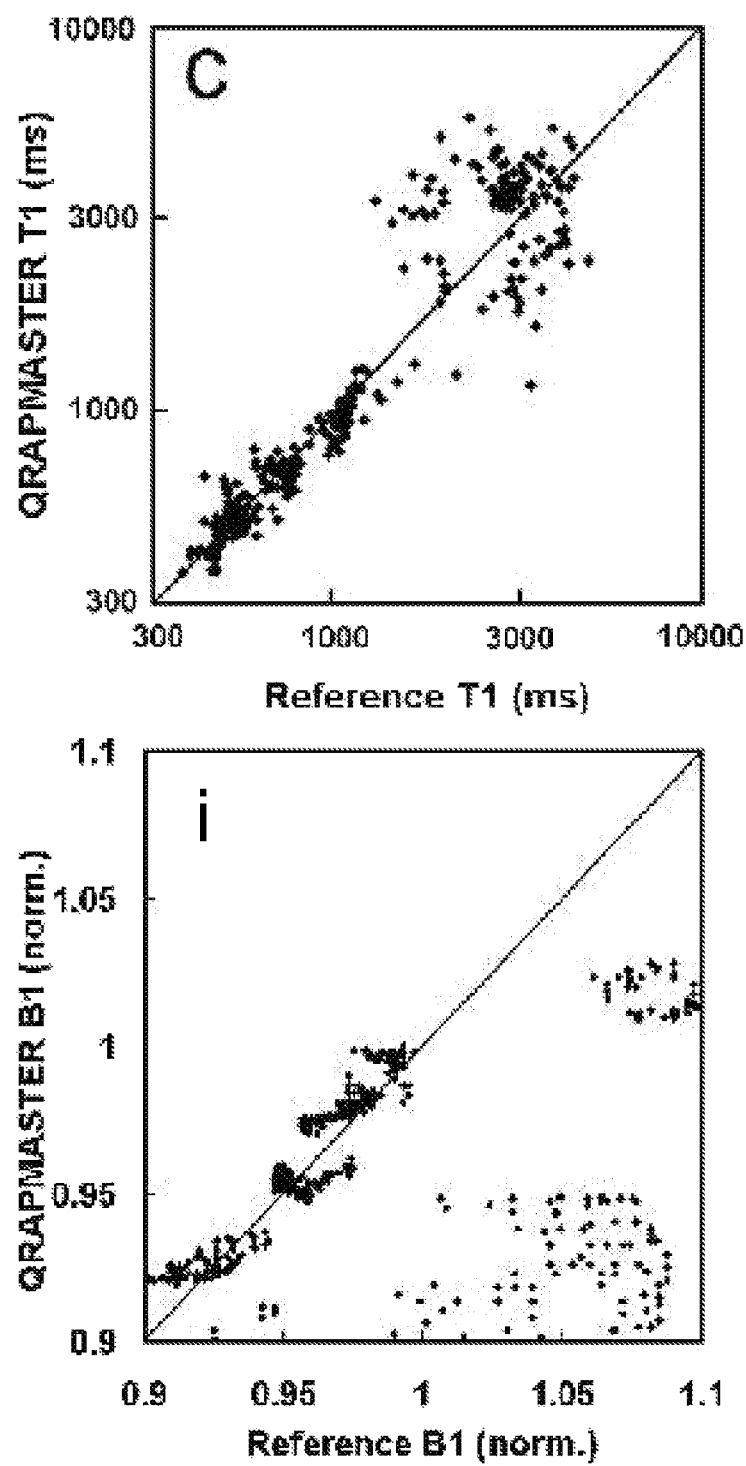
Figure 5:
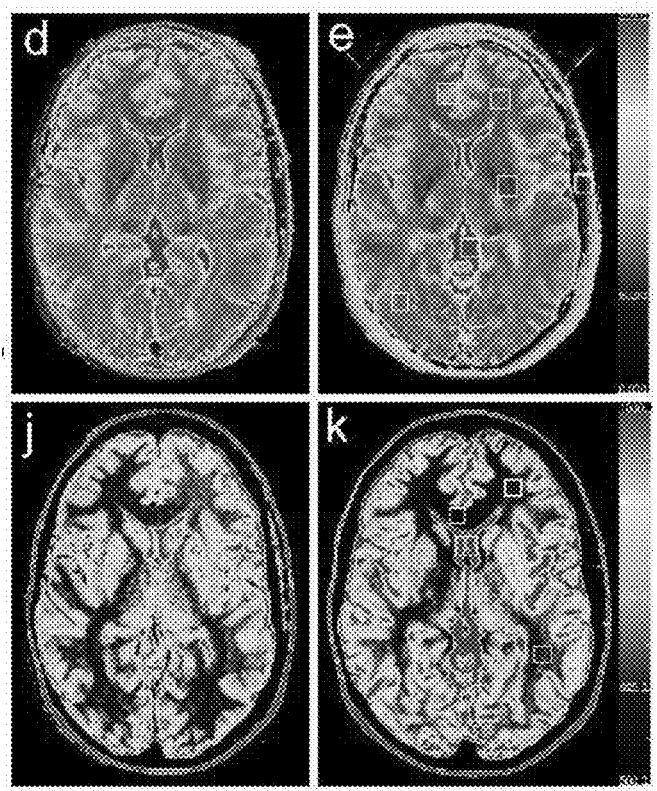
Figure 5:
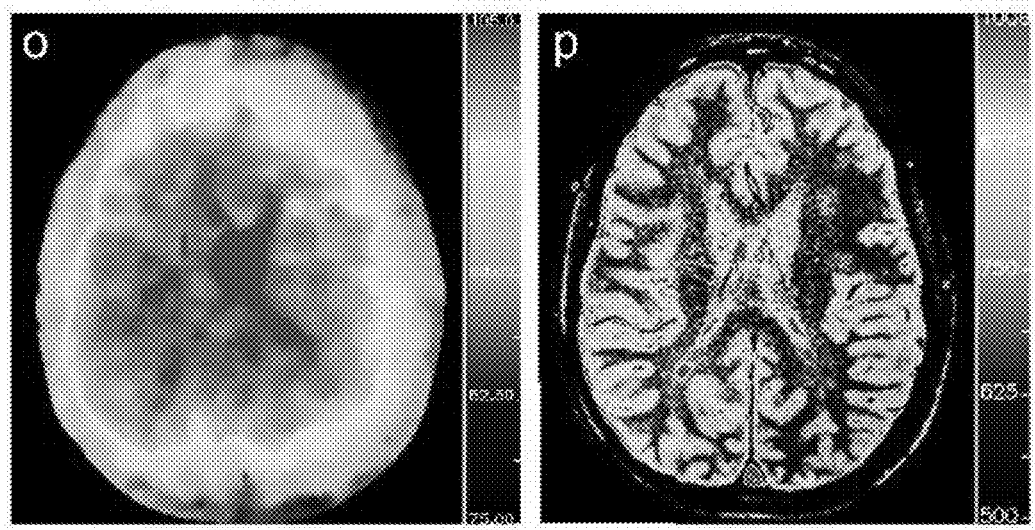
Figure 5:
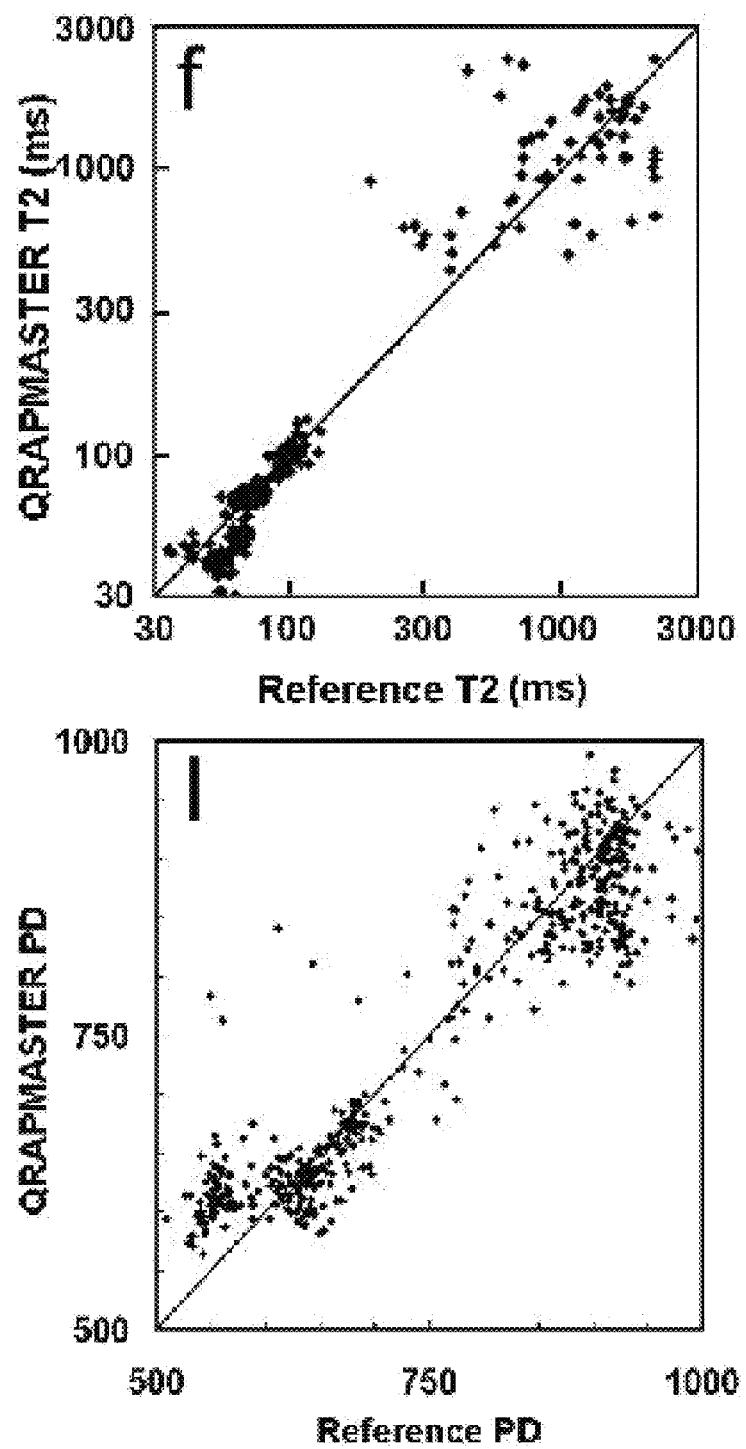
Figure 6:
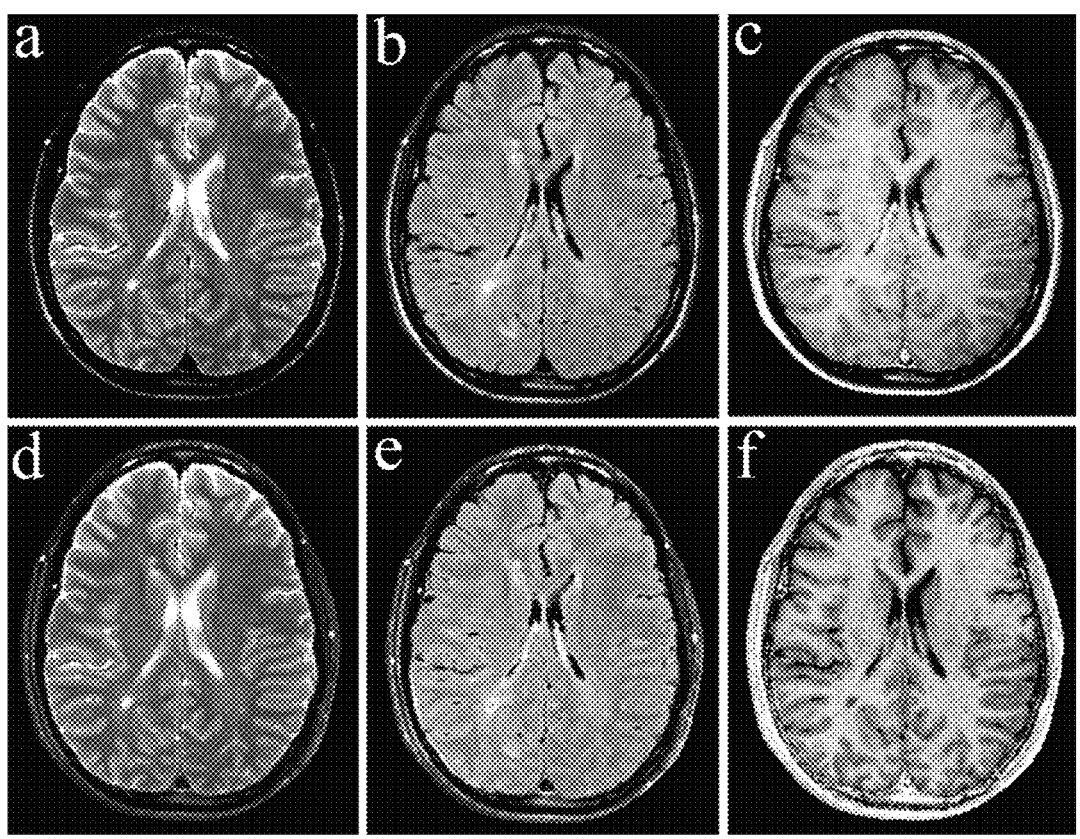

FIG. 6 shows the $T_2$W and $T_2$W-FLAIR images together with the $T_1$W image of the axial slice after administration of Gadolinium contrast. The top panel shows the conventionally acquired images, and the bottom panel displays the corresponding synthetic contrast images, based on the data shown in FIGS. 5m-p. The synthetic MR images were calculated using identical scanner settings as the conventional images. Upon visual inspection, there is excellent agreement in contrast appearance between conventional and synthetic images, both for normal tissue and pathology. The mean difference between the conventional and synthetic T2W images is 17%, FLAIR images is 16% and T1W images is 18%. These large differences, however, are mainly due to the variation in signal intensity of the subcutaneous fat and the skull in the images. If the brain is segmented, the mean differences are 10% for T2W images, 7% for FLAIR images and 9% for T1W images. The most striking difference between the images is the appearance of blood in the T1W image. In the conventional T1W, the blood is Gadolinium enhanced, whereas it is strongly suppressed in the synthetic T1W since the quantification sequence results in black blood.

Figure 7:
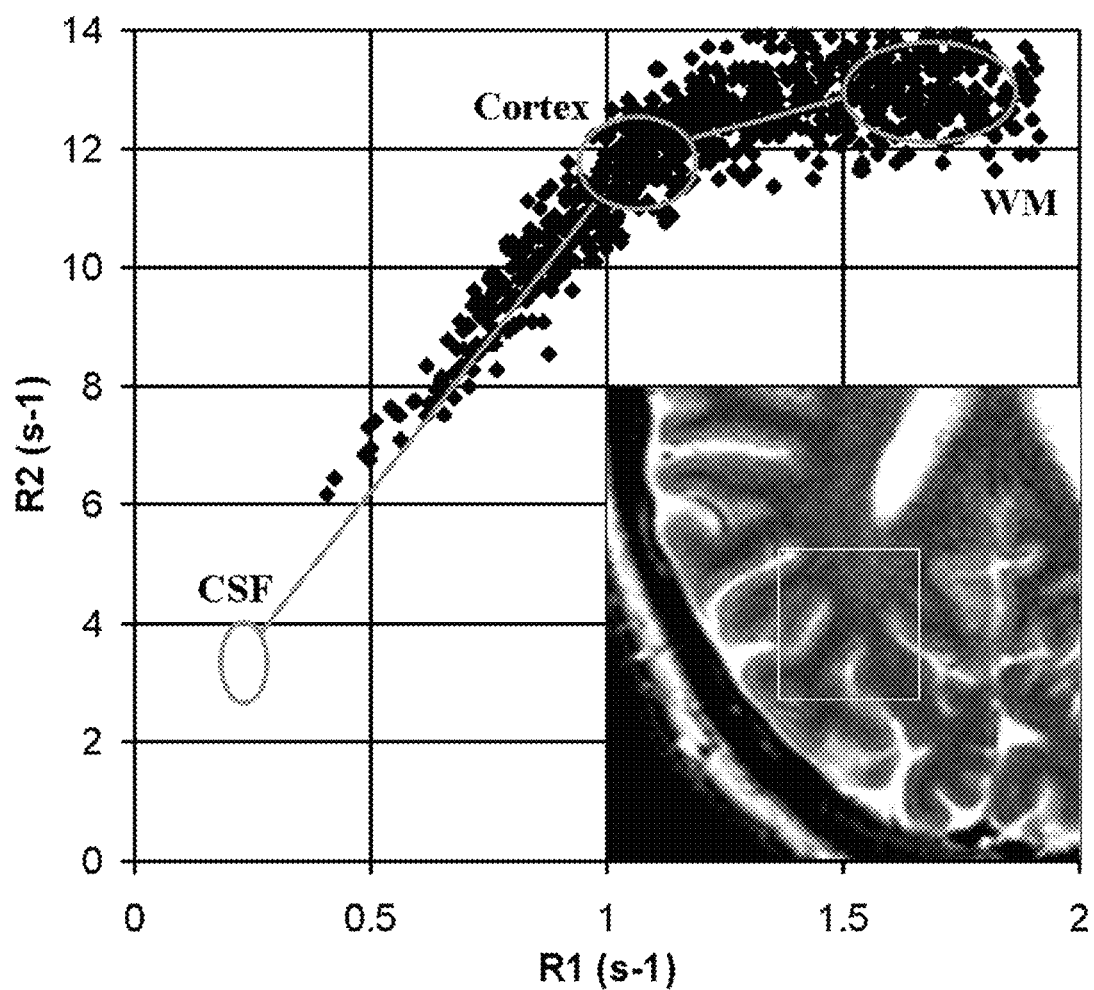

To visualize the quantification results for the $T_2$ hyper-enhancement of the patient the three measured parameters were used as coordinates in a Carthesian $R_1$-$R_2$-PD space, where the longitudinal relaxation rate $R_1$=1/$T_1$ and the transverse relaxation rate $R_2$=1/$T_2$. All tissues then group into characteristic clusters. Voxels containing a mixture of two different kinds of tissues appear on a straight line between both clusters. The position on this line is a weighted average of the partial volume of the corresponding tissue types. FIG. 7 shows a scatter plot of such a visualization from a small portion of the brain from a healthy volunteer, indicated by the ROI in the $T_2$ weighted image (inset). Only the projection of $R_1$-$R_2$-PD space onto the $R_1$-$R_2$ plane is shown. The tissue clusters of white matter (WM), cortex and CSF are clearly observed, as well as the voxels containing both tissue types. The amount of CSF in the gyri inside the ROI is so small that there are no voxels present consisting entirely of CSF. The reference positions of the separate clusters were obtained from Table 1 and are highlighted by the grey circles in FIG. 7. The patient with Multiple Sclerosis is similarly visualized in FIG. 8. It can be observed from the data points that MS lesions have distinctively different values than normal tissue on this $R_1$-$R_2$ plot. Lesions even seem to have two distinct phases, as indicated by the two grey lines over the data points. In the first phase, there is a differentiation from normal white matter with a significant reduction in $R_2$, from WM $R_1$=1.75 s$^{-1}$ and $R_2$=13.3 s$^{-1}$ towards $R_1$=1.54 s$^{-1}$ and $R_2$=10.5 s$^{-1}$ ($T_1$=650 ms and $T_2$=95 ms), indicated by the first grey dot. Simultaneously, the water content increases slightly from 650 to 680. This affected area covers about one-quarter of the ROI around the hyper-intense spot in the $T_2$-weighted image. Although these changes are significant they only show up as faint white areas in the $T_2$W and $T_2$W-FLAIR images and might not be considered for diagnosis. The actual hyper-enhanced spots on the contrast images consist of a dramatic increase in all three parameters, representing the second phase in the lesion data of FIG. 8. The water content has increased to 1000 at $R_1$= 0.61 s$^{-1}$ and $R_2$=5.88 s$^{-1}$ ($T_1$=1650 ms and $T_2$=170 ms), indicated by the second grey dot. At this position the destruction of white matter appears to be complete and is replaced by liquid. The relaxation rates of a lesion might even be lower, though this appears more to reflect the composition of the lesional liquid. The development of MS lesions over these two phases is in line with the observation of enhanced intensity in a FLAIR image at an early stage, and a darker appearance at a later stage of the lesioning process.

Discussion

As shown in the results absolute values for the longitudinal $T_1$ relaxation, the transverse $T_2$ relaxation, the proton density PD and the local Radio-Frequency $B_1$ field can be determined within a clinically acceptable time of 5 minutes, covering the complete brain with high resolution. A significant strength of the presented QRAPMASTER method is that it not only measures all relevant MR parameters simultaneously, such that the acquired signal is utilized for an accurate estimation of the complete set of parameters, it also includes, considered especially important, an intrinsic correction for $B_1$ inhomogeneity. The RF pulse simulation helped the understanding of signal behavior using non-ideal slice-selective RF pulses, and also improved the fitting algorithm. Reproducible results measured in a group of volunteers agreed well with literature values. The comparison with reference methods showed good correspondence of the obtained values. However, a rapid method is clearly essential for quantification, since the long scan time of all reference methods combined unavoidably leads to misregistration and thus inaccurate results, especially for PD.

Care should be taken in the interpretation of the absolute MR parameters. In our approach, using only a low number of relaxation data points, we assume a mono-exponential decay for the relaxation times. For many tissues, $T_1$ and $T_2$ relaxation might be multi-exponential [10, 11], which reflects an underlying partition of the water in various microscopic environments, and is often considered for date analysis using stretched exponentials. Furthermore, note that the brain anatomies are far more complex and differentiated than what appears from Table 1. The standard deviation of the values within a single volunteer is larger than the standard deviation within the whole group, suggesting that part of the variance in the absolute values is owing to intrinsic tissue inhomogeneity rather than to noise. For clinical use, however, it is important to find a consistent change of tissue parameters as compared to normal values. From Table 1, it is clear that healthy tissue has a narrow range of values that can be taken as a reference value to distinguish pathology.

Figure 8:
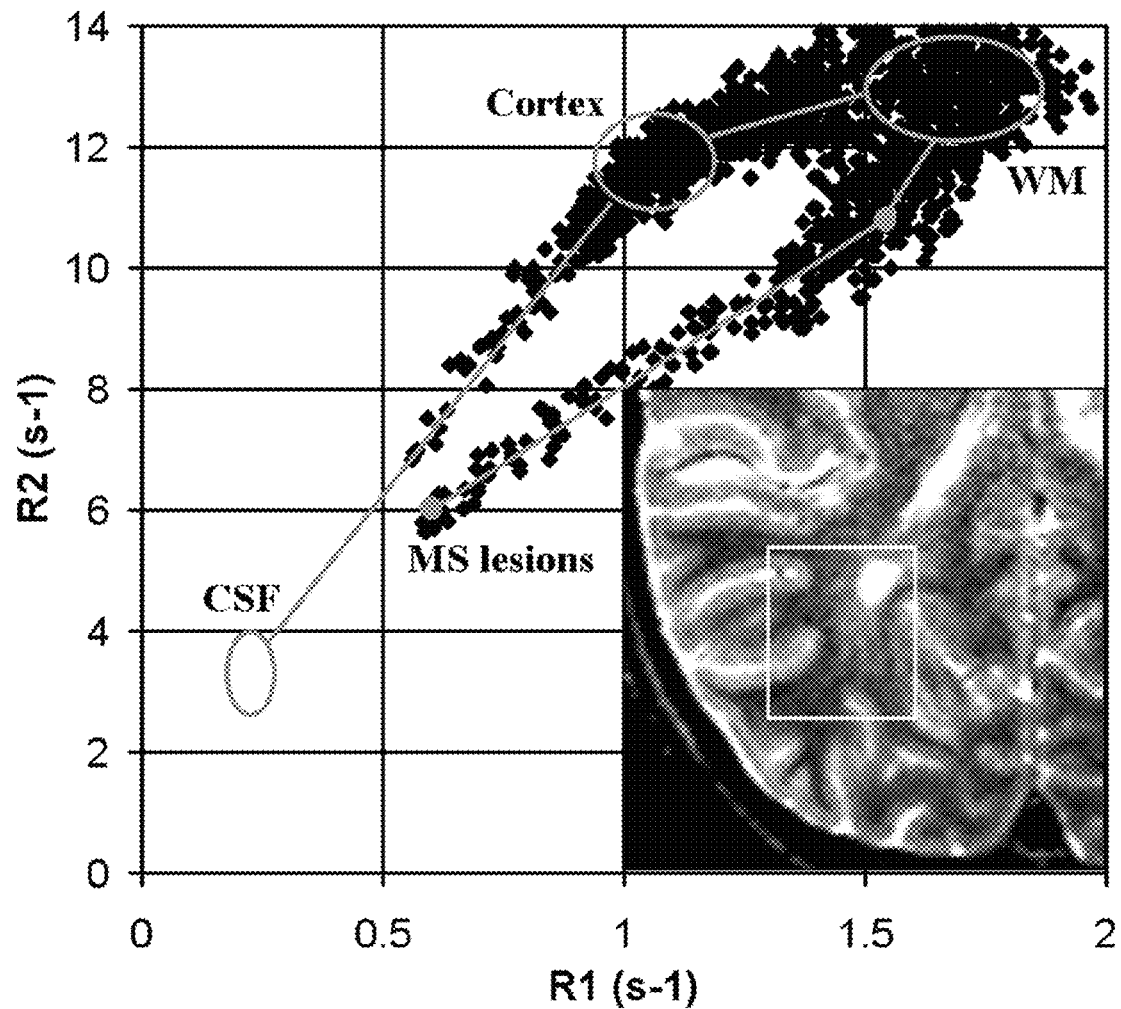

An example of clinical absolute quantification is shown on a patient afflicted by Multiple Sclerosis. The lesions inside the white matter clearly show up as a simultaneous increase of $T_1$, $T_2$ and PD. Using conventional imaging, only the most pronounced affected areas can be distinguished, and various ways of relating area size to the clinical symptoms of the disease have been proposed [e.g. 23-25]. Based on contrast images alone, with significant variation between MR scanners related to scanner parameters and particular software versions, it is very difficult to automatically segment the plaques reliably [26, 27]. Using absolute quantification, however, the scanner dependency is in principle removed and the deviation from normal white matter and the absolute progress of the lesions can be accurately visualized, as shown in FIGS. 7 and 8.

It is important to note that the signal of flowing blood is suppressed in the QRAPMASTER sequence. This might explain the nearly equal relaxation values of the MS patient before and after Gd injection, since the blood component of the effective relaxation per voxel is not visible.

An actual blood-brain barrier leakage, however, would show up since the infiltrated brain tissue is static. Using the relaxation parameters, partial volume of the tissue can be calculated and a more accurate measure for the stage and total volume of MS lesions could potentially be retrieved with sufficient accuracy for clinical diagnosis. This is a promising result and invites further investigation. Other clinical examples of quantification with important partial volume effects are the estimation of excess water content in case of oedema or the extent of neurosarcoidosis.

A future widespread clinical use of absolute quantification of the MR parameters could be facilitated by the application of Synthetic MRI. FIG. 6 shows that the synthetic contrast images, based on the absolute parameter maps of FIG. 5, reflect tissue contrast very similar to that observed in conventional contrast images. An important difference between conventional and synthetic contrast images is that the latter are based on absolute values. Not only do the images have perfect registration, but all scanner dependencies, such as $T_R$, $T_E$ or $B_1$ inhomogeneity, are in fact merely artificially added parameters for familiarity. Since Synthetic MRI allows the computation of an infinite number of different contrast weighted images, it could be a very useful technique for screening purposes with any relevant combination of the scanner settings $T_E$, $T_R$, $\alpha$, and $T_{IR}$ where the optimal set of contrast parameter settings is unknown a priori. A radiologist could have the absolute parameter maps next to the apparently normal contrast images based on the same quantification scan. Potentially, this combination might replace the acquisition of a whole series of conventional images and perhaps save valuable scanner time.

Conclusions

The presented QRAPMASTER method describes rapid quantification of $T_1$ and $T_2$ relaxation, proton density and $B_1$ field, covering the brain at high resolution in a scan time of only 5 minutes. Such an absolute measurement would support diagnosis with quantitative values for the progress of diseases. Validation is done on a group of volunteers and a clinical example of the technique application on a patient with Multiple Sclerosis is shown. Synthetic contrast images are generated from the same quantification data set as a visual aid for the clinical radiologist to verify the results without the need to use a plethora of different acquisition series that consume valuable scanning time. We expect that rapid quantification and subsequent image synthesis will be an important clinical tool in the near future.

References

1. Tofts P. Quantitative MRI of the Brain. Wiley 2003.
2. Warntjes J B M, Dahlqvist O, Lundberg P. A Novel Method for Rapid, Simultaneous $T_1$, $T_2$* and Proton Density Quantification. Magn Reson Med 2007; 57:528-537.
3. Neeb H, Zilles K, Shah N J. A new method for fast quantitative mapping of absolute water content in vivo. Neuro Image 2006; 31:1156-1168.
4. Deoni S C L, Rutt B K, Peters T M. High resolution $T_1$ and $T_2$ mapping of the brain in a clinically acceptable time with DESPOT1 and DESPOT2. Magn Reson Med 2005; 53:237-241.
5. Deoni S C L. High-resolution T1 mapping of the brain at 3T with driven equilibrium single pulse observation of T1 with high-speed incorporation of RF field inhomogeneities (DESPOT1-HIFI). J Magn Res Imaging 2007; 26:1106-1111.
6. Deichmann R. Fast high-resolution $T_1$ mapping of the human brain. Magn Reson Med 2005; 54:20-27.
7. Zhu D C, Penn R D. Full brain $T_1$ mapping through inversion recovery fast spin echo imaging with time-efficient slice ordering. Magn Reson Med 2005; 54:725-731.
8. Ordidge R J, Gibbs P, Chapman B, Stehling M K, Mansfield P. High-speed multi-slice $T_1$ mapping using inversion recovery echo planar imaging. Magn Reson Med 1990; 16:238-245.
9. Clare S, Jezzard P. Rapid $T_1$ mapping using multislice echo planar imaging. Magn Reson Med 2001; 45:630-634.
10. Whittall K P, MacKay A L, Douglas A G, Graeb D A, Nugent R A, Li D K B, Paty D W. In vivo measurements of $T_2$ distributions and water contents in normal human brain. Magn Reson Med 1997; 37:34-43.
11. MacKay A, Laule C, Vavasour I, Bjarnason T, Kolind S, Madler B. Insights into brain microstructure from the T2 distribution. Magn Reson Imaging, 2006; 24:515-525.
12. Oh J, Cha S, Aiken A H, Han E T, Crane J C, Stainsby J A, Wright G A, Dillon W P, Nelson S J. Quantitative apparent diffusion coefficients and T2 relaxation times in characterizing contrast enhancing brain tumors and regions of peritumoral edema. J Magn Reson Imaging. 2005; 21701-21708.
13. McKenzie C A, Chen Z, Drost D J, Prato, F S. Fast acquisition of quantitative $T_2$ maps. Magn Reson Med 1999; 41:208-212.
14. Ernst T, Kreis R, Ross B D. Absolute quantitation of water and metabolites in the human brain. 1: Compartments and water. J Magn Res Ser B 1993; 102:1-8.
15. Riederer S J, Lee J N, Farzeneh F, Wang H Z, Wright R C. Magnetic resonance image synthesis: Clinical implementation. Acta Radiol Suppl 1986; 369:466-468.
16. Bobman S A, Riederer S J, Lee J N, Suddarth S A, Wang B P, Drayer B P, MacFall J R. Cerebral magnetic resonance image synthesis. Am J Neuro Rad 1985; 6:265-269.
17. Redpath T W, Smith F W, Hutchison J M, Magnetic resonance image synthesis from an interleaved saturation recovery/inversion recovery sequence. Br J. Radiol. 1988; 61:619-24.
18. Zhu X P, Hutchinson C E, Hawnaur J M, Cootes T F, Taylor C J, Isherwood I. Magnetic resonance image synthesis using a flexible model. Br J Radiol 1994; 67:976-82.
19. Gulani V, Schmitt P, Griswold M A, Webb A G, Jakob P M. Investig Radiol 2004; 39:767-74.
20. Hacklander T, Mertens H. Virtual MRI: a PC-based simulation of a clinical MR scanner. Acad radiol 2005; 12:85-96.
21. Haacke E M. Magnetic Resonance Imaging, Physical Principles and Sequence Design. Wiley 1999.
22. Kellman P, Arai A E, McVeigh E R, Aletras A H. Phase-sensitive inversion recovery for detecting myocardial infarction using gadolinium-delayed hyperenhancement. Magn Reson Imag. 2002; 47:372-282.
23. Bakshi R, Hutton G J, Miller J R, Radue E W. The use of magnetic resonance imaging in the diagnosis and long-term management of multiple sclerosis. Neurology 2004; 63:S3-11.
24. Fazekas F, Soelberg-Sorensen P, Comi G, Filippi M. MRI to monitor treatment efficacy in multiple sclerosis. J Neuroimaging 2007; 17:50 S-55S.
25. Neema M, Stankiewicz J, Arora A, Dandamudi V S, Batt C E, Guss Z D, Al-Sabbagh A, Bakshi R. T1- and T2-based MRI measures of diffuse gray matter and white matter damage in patients with multiple sclerosis. J Neuroimaging 2007; 17:16 S-21S.
26. Datta S, Sajja B R, He R, Gupta R K, Wolinsky J S, Narayana P A. Segmentation of gadolinium-enhanced lesions on MRI in multiple sclerosis. J Magn Reson Imaging 2007; 25:932-937.
27. Achiron A, Gicquel S, Miron S, Faibel M. Brain MRI lesion load quantification in multiple sclerosis: a comparison between automated multispectral and semi-automated thresholding computer-assisted techniques. Magn Reson Imaging 2002; 20:713-720.

Figures

FIG. 1. Schematic representation of a single block of the QRAPMASTER quantification sequence. Shown are the measurement (Gm), phase-encoding (Gp) and slice-selection (Gs) gradients and the RF pulse amplitude over time. There are two phases in each block. In Phase 1 (Saturation), the 120° saturation pulse θ and subsequent spoiling acts on a slice m. In Phase 2 (Acquisition), the multi-echo spin echo acquisition is performed of slice n, using the 90° excitation pulse α and multiple 180° refocusing pulses. The spin echo acquisition is accelerated with an Echo Planar Imaging read-out scheme.

FIG. 2. The measured effective flip angle of the nominal 90° excitation pulse α the nominal 120° saturation pulse θ and the nominal 180° refocusing pulse as a function of normalized slice thickness. The solid lines are the simulated flip angles based on the RF amplitude profile of the non-ideal pulses. The dashed lines indicate the effect of ideal slice-selective RF pulses.

Figure 3:
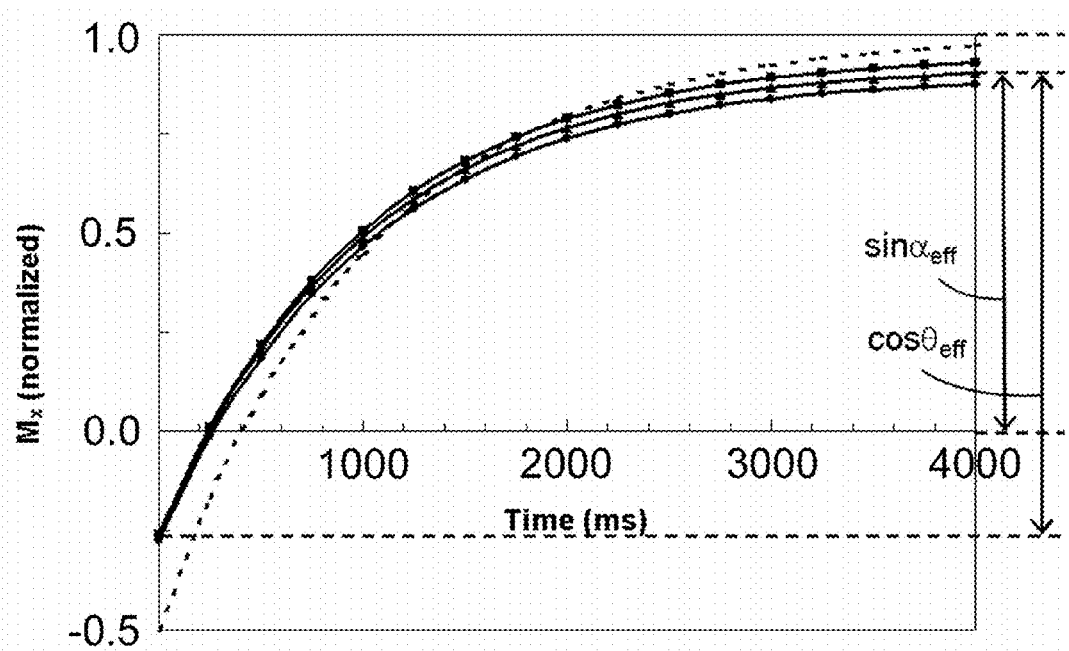

FIG. 3. The simulated signal intensity of the measurement on a phantom with a $T_1$ of 1000 ms. The longitudinal magnetization is initialized to unity for a completely relaxed system. A 120° saturation pulse is applied at time 0. The normalized signal intensity of a multi-echo spin echo acquisition is plotted, performed at a time between 0 and 4000 ms. The dotted line indicates the ideal behavior. The solid lines are the echo intensities using the imperfect RF pulses as shown in FIG. 2. The first echo has a lower intensity and the second spin echo has a higher intensity than the average intensity of the first 10 echoes. The arrows indicate the calculation of $\sin(\alpha_{eff})$ and $\cos(\theta_{eff})$ from these curves.

Figure 4:
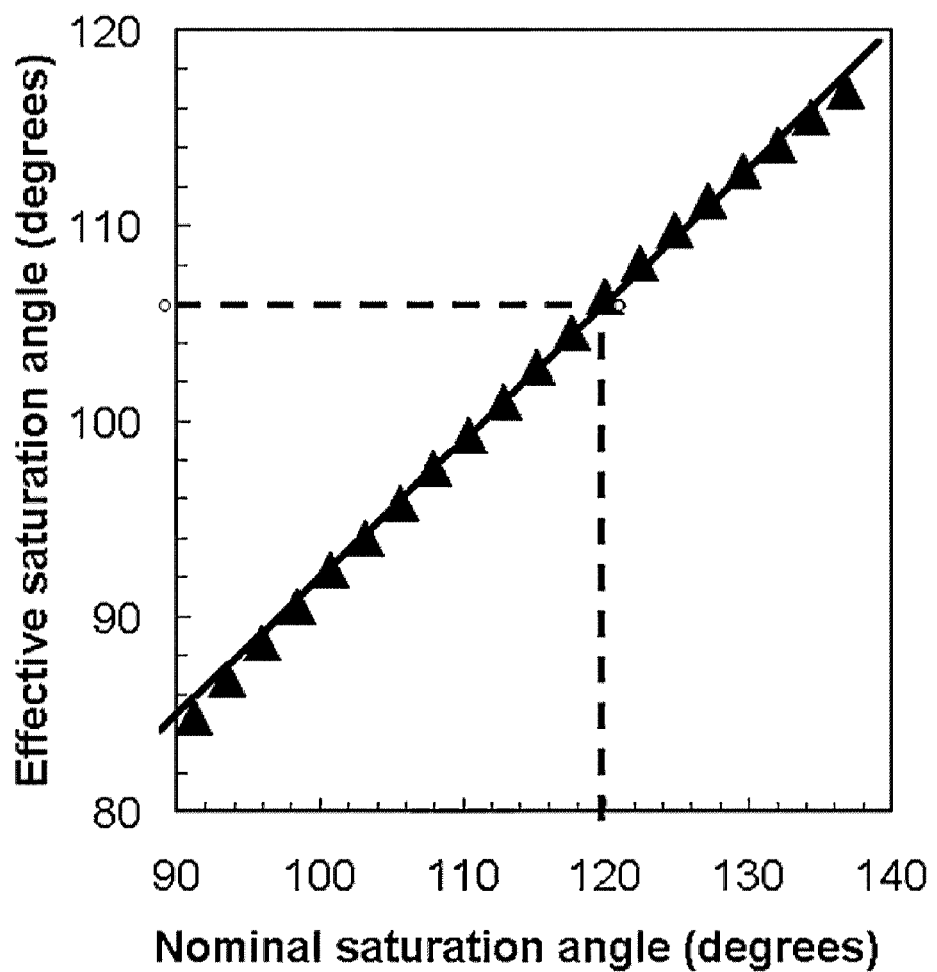
Figure 4:
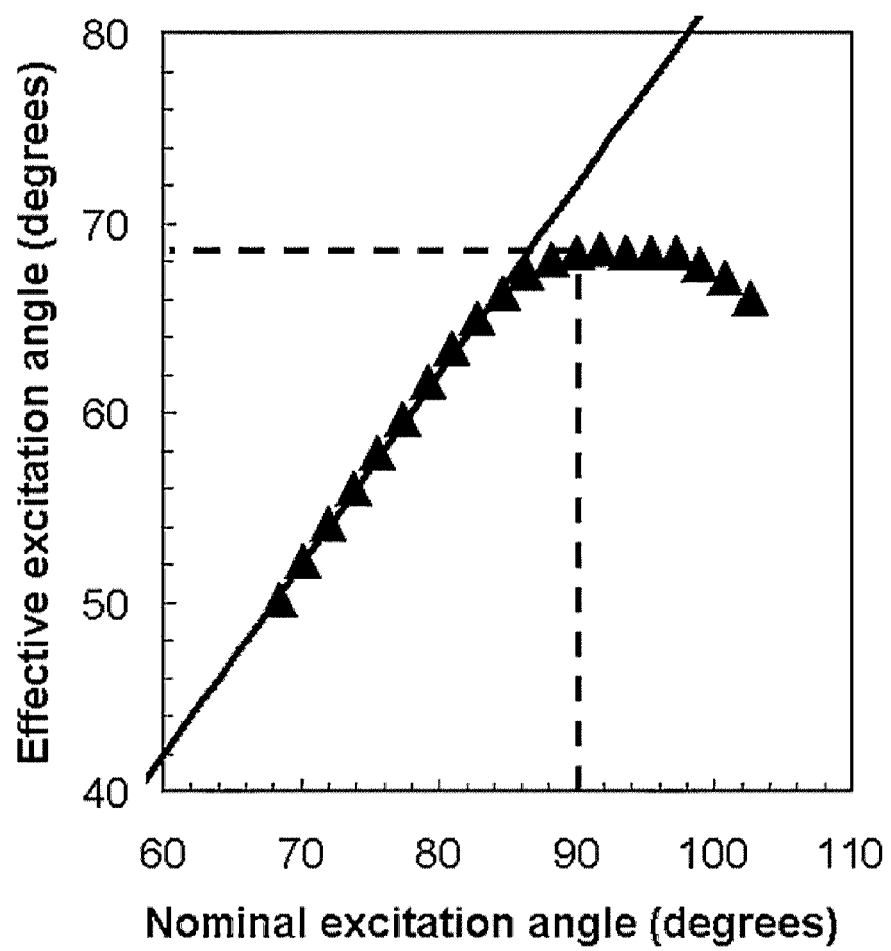
Figure 4:
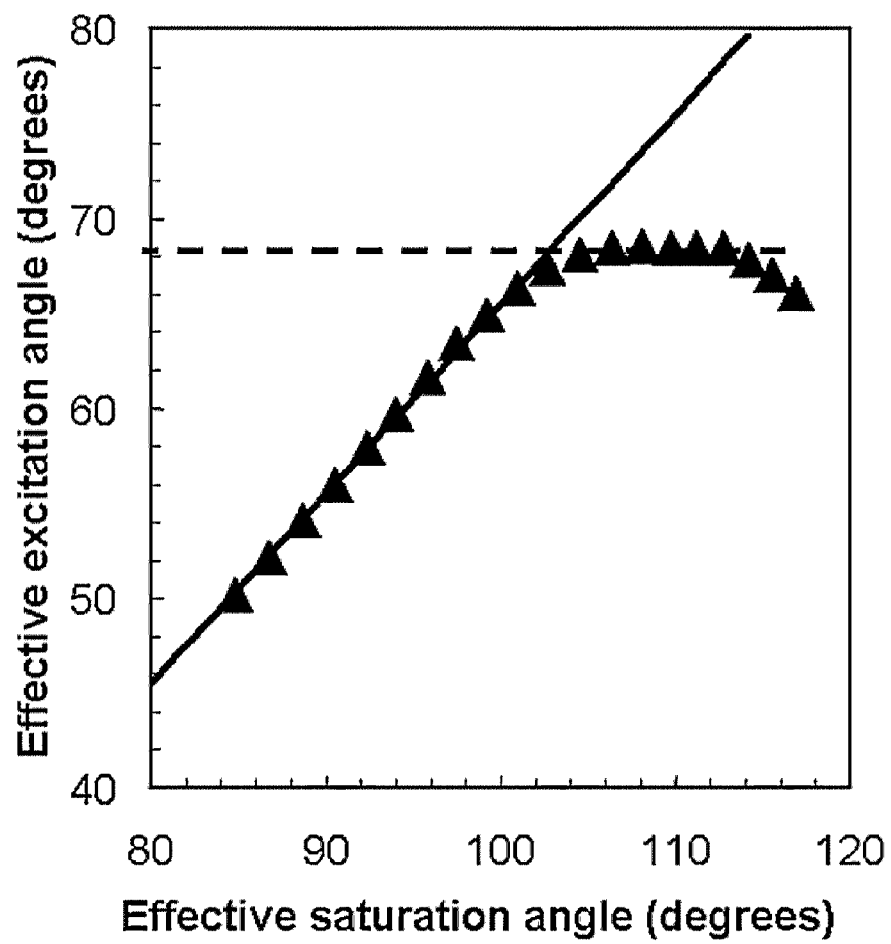

FIG. 4. a) Simulation of the relation of the nominal saturation flip angle α and the observed effective saturation flip angle $\theta_{eff}$ based on the fitting of the $T_1$ curves of the quantification measurement shown in FIG. 3. b) Similar for the nominal excitation flip angle α and the effective excitation flip angle $\alpha_{eff}$. c) The observed effective saturation flip angle $\theta_{eff}$ related to the effective excitation flip angle $\alpha_{eff}$.

FIG. 5. Application of the QRAPMASTER method on the brain. The in-plane resolution is 0.8 mm, the slice thickness is 5 mm, 20 slices are acquired in a scan time of 5.14 minutes. a) The values of the longitudinal $T_1$ relaxation (ms) obtained by QRAPMASTER and b) by the reference standard inversion recovery. c) the comparison of the two methods of all pixels inside the indicated Regions of Interest. d-f) Similar for the transverse $T_2$ relaxation compared to a standard 3D multi-echo sequence, g-i) Similar for the $B_1$ field compared to the standard flip angle sweep method, j-l) Similar for the proton density compared to all reference methods combined. m-p) Application of the quantification method on a patient with Multiple Sclerosis.

FIG. 6. Contrast images of the identical slice as shown in FIG. 5. The patient moved slightly over the various scans. The top row was acquired conventionally, the bottom row was synthesized based on the quantified data displayed in FIG. 5. a,d) T$_2$-weighted image (T$_R$=4400 ms, T$_E$=100 ms, α=90°), b,e) T$_2$-weighted FLAIR image (T$_R$=6000 ms, T$_E$=120 ms, T$_{ID}$=2000 ms, α=90°), c,f) T$_1$-weighted image 5 minutes after the administration of Gd contrast media (T$_R$=550 ms, T$_E$=15 ms, α=90°).

FIG. 7. Projected scatter plot of the absolute values of a small part of the brain of a healthy volunteer indicated by the region of interest in the T$_2$ weighted image (inset). The relaxation rate R$_2$ is shown as a function R$_1$. The cluster positions of white matter (WM), cortex and cerebro-spinal fluid (CSF), are high-lighted based on the values of Table 1.

FIG. 8. Similar scatter plot as in FIG. 7, applied on a patient with MS. The apparent two phases of MS lesion development are indicated by the two grey lines separated by dots.

What is claimed is:

1. A method of processing a set of a number of x magnetic resonance (MR) slices, into a displayable form comprising:
   in a pre-pulse-only stage, using only one slice-selective pre-pulse, wherein the one slice-selective pre-pulse in the pre-pulse-only stage is used in order to saturate or invert a spin magnetization of a single first slice n within the set of the number of x MR slices; and
   in an acquisition stage, using a slice-selective, multi-echo acquisition of a second slice m within the set of the number of x MR slices, the single second slice m being different from the single first slice n;
   wherein each of the pre-pulse-only and acquisition stages are interleaved, in a computer as part of an MR sequence, wherein n and m are integers in a range of 1 . . . x, and the MR sequence is repeated, in order to account for the set number of the x MR slices,
   whereby a delay between the pre-pulse only processing stage and the acquisition stage of each particular slice is varied and an echo time of each particular slice is varied, resulting in a plurality of displayable MR images with different respective image contrasts, varying echo times, and varying delays from the processed set number of x MR slices.

2. The method of claim 1, wherein the pre-pulse has a flip angle e is within the range of 90-180 degrees where 90 degrees corresponds to a saturation pre-pulse and 180 degrees corresponds to an inversion pre-pulse.

3. The method of claim 1, wherein the acquisition corresponds to a multi-echo spin echo acquisition including refocusing pulses which occur between the echo read-outs.

4. The method of claim 1, wherein the acquisition corresponds to a multi-echo gradient echo acquisition without refocusing pulses occurring between the echo read-outs.

5. The method of claim 1, wherein each echo read-out generates a single k-space line in k-space.

6. The method of claim 1, wherein each echo read-out generates multiple k-space lines in k-space using an Echo-Planar Imaging (EPI) technique.

7. The method of claim 1, further comprising generating a matrix of MR images with size a×b having a variation of a echo times and having a variation of b delay times which occur after the pre-pulse only processing stage.

8. The method of claim 7, wherein an increasing image intensity of the matrix of MR images is viewable as a function of delay time after the pre-pulse only processing stage is used to determine a T1 relaxation of each MR image pixel in the imaged object.

9. The method of claim 7, wherein a decreasing image intensity of the matrix of MR images is viewable as a function of echo time, when echo time is used in order to determine a T2 relaxation of each MR image pixel in the imaged object.

10. The method of claim 7, wherein the ratio between the lowest and highest MR image intensity is found as a function of delay time after the pre-pulse only processing stage is used in order, to estimate a B1 field of each image pixel in the imaged object.

11. The method of claim 7, wherein a proton density of each image pixel in an imaged object is estimated by correcting an MR image intensity with respect to the T1, T2 and B1 effects.

12. An imaging system configured for generating displayable magnetic resonance imaging (MRI) images using a magnetic resonance (MR) sequence on a set of a number of x slices, wherein the MR sequence includes:
   at least two interleaved processing stages, the MR sequence itself comprising:
      a pre-pulse-only processing stage including only one slice-selective pre-pulse, the only one slice-selective pre-pulse being used in order to saturate or invert a spin magnetization of a single first slice n within the set of the number of x MR slices, and
      an acquisition processing stage including a slice-selective, multi-echo acquisition of a single second slice m within the set of the number of x MR slices, the single second slice m being different from the single first slice n; where both n and m are integers in the range of 1 . . . x, and the imaging system is configured to repeat the MR sequence, in order to account for the set number of the x MR slices, where a delay between the pre-pulse only processing stage and the acquisition stage of each particular slice is varied, and an echo time of each particular slice is also varied, resulting in a plurality of displayable MR images being generated by the imaging system with different respective image contrasts, varying echo times, and varying delays.

13. The imaging system of claim 12, wherein the system is configured to generate a pre-pulse having a flip angle e is within the range of 90-180 degrees, where 90 degrees corresponds to a saturation pre-pulse and 180 degrees corresponds to an inversion pre-pulse.

14. The imaging system of claim 12, wherein the system is configured to let the acquisition correspond to a multi-echo spin echo acquisition including refocusing pulses which occur between the echo read-outs.

15. The imaging system of claim 12, wherein the system is configured to let the acquisition correspond to a multi-echo gradient echo acquisition without refocusing pulses occurring between the echo read-outs.

16. The imaging system of claim 12, wherein the system is configured to let each echo read-out generate a single k-space line in k-space.

17. The imaging system of claim 12, wherein the system is configured to let each echo read-out generate multiple k-space lines in k-space using the Echo-Planar Imaging (EPI) technique.

18. The imaging system of claim 12, further comprising a module configured for generating a matrix of MR images with size a×b having a variation of a echo times and having a variation of b delay times which occur after the pre-pulse only processing stage.

19. The imaging system of claim 18, further comprising a module configured for determining a T1 relaxation of each image pixel in an imaged object, based on an increasing image intensity of the matrix of MR images as a function of delay time, after the pre-pulse only processing stage occurs.

20. The imaging system of claim 18, further comprising a module configured for determining a T2 relaxation of each MR image pixel, based on a decreasing image intensity of the matrix of MR images as a function of echo time.

21. The imaging system of claim 18, further comprising a module configured for determining a B1 field of each image pixel in the imaged object, based on the ratio between the lowest and highest image intensity present, as a function of delay time, after the pre-pulse only processing stage occurs.

22. The imaging system of claim 18, further comprising a module configured for determining a proton density of each image pixel in an imaged object is estimated by correcting an image intensity with respect to the T1, T2 and B1 effects.

23. A non-transitory computer readable medium that when executed by a computer processor of a magnetic resonance imaging system causes the computer processor to initiate executing computer program segments configured for processing a set of a number of x magnetic resonance (MR) slices into a displayable form, wherein the processing comprises, in a pre-pulse-only stage:, using only one slice-selective pre-pulse, wherein the one slice-selective pre-pulse, in the pre-pulse-only stage, is used in order to saturate or invert a spin magnetization of a single first slice n within the set of the number of x MR slices; and in an acquisition stage, using a slice-selective, multi-echo acquisition of a single second slice m within the set of the number of x MR slices with the single second slice m being different from the single first slice n;

the pre-pulse-only processing stage and acquisition stage are interleaved in an MR sequence, and n and m are integers in a range of 1 . . . x;

the MR sequence is repeated, in order to account for the set number of the x MR slices, where a delay occurring between the pre-pulse only processing stage and the acquisition stage of each particular MR slice is varied, and an echo time of each particular slice is also varied, resulting in the formation of a plurality of displayable MR images with different respective image contrasts, varying echo times, and varying delays from the processed set number of x MR slices.

\* \* \* \* \*